(12) United States Patent
Yobas et al.

(10) Patent No.: US 8,524,174 B2
(45) Date of Patent: Sep. 3, 2013

(54) FLUID CARTRIDGE, PUMP AND FLUID VALVE ARRANGEMENT

(75) Inventors: Levent Yobas, Singapore (SG); Lih Feng Cheow, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 676 days.

(21) Appl. No.: 12/593,487

(22) PCT Filed: Feb. 29, 2008

(86) PCT No.: PCT/SG2008/000072
§ 371 (c)(1),
(2), (4) Date: Jun. 2, 2010

(87) PCT Pub. No.: WO2008/118098
PCT Pub. Date: Oct. 2, 2008

(65) Prior Publication Data
US 2010/0288382 A1    Nov. 18, 2010

Related U.S. Application Data

(60) Provisional application No. 60/896,980, filed on Mar. 26, 2007.

(51) Int. Cl.
| | | |
|---|---|---|
| B01L 3/00 | (2006.01) |
| A61J 1/06 | (2006.01) |
| G01N 1/10 | (2006.01) |
| G01N 1/18 | (2006.01) |
| G01N 33/00 | (2006.01) |
| E03B 7/07 | (2006.01) |
| F03B 11/02 | (2006.01) |
| F15C 1/00 | (2006.01) |
| F15C 1/06 | (2006.01) |
| G01N 35/00 | (2006.01) |

(52) U.S. Cl.
USPC ........... 422/554; 422/502; 422/504; 422/505; 422/507; 436/177; 436/180; 73/1.02; 137/561 R; 137/563; 137/565.01; 137/803; 137/833

(58) Field of Classification Search
USPC .................................................. 422/500–562
See application file for complete search history.

(56) References Cited

U.S. PATENT DOCUMENTS
6,368,871 B1   4/2002   Christel et al.
6,379,626 B1   4/2002   Munson et al.
(Continued)

FOREIGN PATENT DOCUMENTS
DE     10222478 A1    12/2003
EP      1539350 A1 *  6/2005
(Continued)

OTHER PUBLICATIONS

Kim et al., "A Disposable DNA Sample Preparation Microfluidic Chip for Nucleic Acid Probe Assay" Proc. of the IEEE Conference on MEMS, 2002, 15, pp. 133-166.

(Continued)

Primary Examiner — Bobby Ramdhanie
Assistant Examiner — Jennifer Wecker
(74) Attorney, Agent, or Firm — Novak Druce Connolly Bove + Quigg LLP

(57) ABSTRACT

A fluid cartridge, comprising a channel layer within which at least one circumferentially sealed fluid channel is formed, the channel layer comprising a substrate and an elastic layer fixedly arranged on the substrate, wherein the substrate has a rigidity being greater than that of the elastic layer, and wherein the at least one fluid channel is defined on at least one side thereof by the elastic layer.

26 Claims, 18 Drawing Sheets

(56) References Cited

U.S. PATENT DOCUMENTS

| | | | |
|---|---|---|---|
| 6,447,661 B1 | 9/2002 | Chow et al. | |
| 6,729,352 B2 | 5/2004 | O'Connor et al. | |
| 6,843,263 B2 * | 1/2005 | Kuo et al. | 137/14 |
| 7,854,897 B2 * | 12/2010 | Tanaami et al. | 422/505 |
| 7,858,045 B2 * | 12/2010 | Tanaami et al. | 422/403 |
| 8,246,832 B2 * | 8/2012 | Lomas et al. | 210/638 |
| 2002/0187560 A1 | 12/2002 | Pezzuto et al. | |
| 2004/0086844 A1 | 5/2004 | Dunfield et al. | |
| 2004/0131502 A1 * | 7/2004 | Cox et al. | 422/99 |
| 2006/0099116 A1 * | 5/2006 | Manger et al. | 422/100 |
| 2007/0202137 A1 * | 8/2007 | Ingham | 424/405 |
| 2008/0038839 A1 * | 2/2008 | Linder et al. | 436/501 |

FOREIGN PATENT DOCUMENTS

| | | | |
|---|---|---|---|
| WO | 03060157 A2 | 7/2003 | |
| WO | WO 03060157 A2 * | 7/2003 | |
| WO | 03072254 A1 | 9/2003 | |
| WO | WO 03072254 A1 * | 9/2003 | |
| WO | 2004043598 A1 | 5/2004 | |
| WO | 2005066343 A1 | 7/2005 | |

OTHER PUBLICATIONS

Written Opinion of the International Searching Authority for PCT/SG2008/000072 mailed Apr. 29, 2008.

International Preliminary Report on Patentability for PCT/SG2008/000072 mailed Jun. 24, 2009.

International Search Report. PCT/SG2008/000072. Mailed May 2, 2008.

* cited by examiner

FLUID CARTRIDGE, PUMP AND FLUID VALVE ARRANGEMENT

CROSS-REFERENCE TO RELATED APPLICATIONS

This application is a National Stage Application under 35 USC §371(c) of PCT Application No. PCT/SG2008/00072, entitled "FLUID CARTRIDGE, PUMP AND FLUID VALVE ARRANGEMENT," filed Feb. 29, 2008, which claims priority to U.S. Provisional Application No. 60/896, 980, filed Mar. 26, 2008 all of which are hereby incorporated by reference herein.

The present invention relates to a fluid cartridge, a pump and a fluid valve arrangement.

The Lab-on-a-chip (LOC) technology has reached a certain level of maturity where fundamental microfluidic operations (e.g. sampling, mixing, filtration, and extraction) can be simply integrated into a point-of-care diagnostic assay. It is believed that such portable assays would decentralize clinical tests and benefit public health tremendously by providing reasonably accurate test results rapidly at a lower cost without resorting to trained personnel and fixed instruments. Despite their success in research settings, these assays are still at large from commercial domain mainly due to a lack of a user-friendly compact fluid pump that can deliver reliable flow rates and a user-friendly compact fluid valve that can reliably regulate fluid flow.

Conventional pumps that are widely used in research settings are mostly mechanical and mainly include syringe pumps and pneumatic pumps (regulated source of pressurized gas or vacuum). Syringe pumps can deliver precise flow rates while pneumatic pumps can maintain a specified gauge pressure. However, these pumps, apart from being bulky, usually burden the user with establishing leak-proof fluidic connections. On the other hand, non-mechanical pumps such as electrokinetic flow control do not need fluidic connections as the pumping action is driven by voltage potentials directly applied across the liquid via electrodes. These pumps are more common in molecular sieving and work based on the principles of electroosmosis or electrophoresis. However, they suffer from drawbacks such as bubble formation around the electrodes and the flow dependence on the liquid composition and surface charge. Moreover, the pumping action requires high voltages typically delivered by a bulky power supply.

Miniaturization of mechanical pumps or micropumps has been an intense field of research in order to attain truly integrated and/or portable microfluidic systems. The vast majority of the micropumps rely on compliant parts (membrane or diaphragm) for displacing volume and additional components for rectifying flow direction (diffuser or check valve). Moreover, actuators driving the compliant parts convert energy input into mechanical work through mechanisms which can be electrostatic, electromagnetic, piezoelectric, thermomechanic, or pneumatic in nature. Most of the earlier micropumps are made of semiconductor-type materials (e.g. silicon or polysilicon) since their miniaturization follows techniques originally developed for integrated circuits. However, such materials are stiff, fragile, and thus can only provide limited volume of displacement given the pump size. Furthermore, most of these micropumps come in contact with the pumped fluid and their sophisticated fabrication disqualifies them from being considered disposable for bioassays.

Further, there exists an inherent limitation with the miniaturization: the pumped energy drops at least several orders of magnitude with the dimensional scaling of the pump actuator whereas the fluidic resistance increases with viscous forces taking over inertia in small microchannels. This could be considered a small price to pay for bypassing the troublesome task of macro-to-micro fluidic interface by having a fully integrated fluid delivery. Although, this integration is paramount to point-of-care diagnostics, such feature should be sought without compromising on the pump performance.

Thus, it would be desirable to have a compact, reliable and nevertheless inexpensive pump and fluid valve which are suitable to be used in LOC-technology.

To this end, the invention provides a fluid cartridge according to claim 1, a pump according to claim 61, a fluid valve arrangement according to claim 76, and a fluid cartridge according to claim 85. Further embodiments of the fluid cartridge, the pump and the fluid valve arrangement are described in the respective dependent claims.

The fluid cartridge according to the present invention is suitable of accommodating one or more fluids (reagent(s), sample(s), product(s)) in the at least one fluid channel thereof and suitable of forming a part of the pump or valve arrangement according to the present invention thereby allowing direct integration of the pump and valve arrangement without the requirement of interface tubing. Further, the fluid cartridge according to the present invention is easy and inexpensive to manufacture and, thus, also fulfils the disposability criterion. The pump according to the present invention can be used in LOC technology and allows for the provision of a self-contained portable microfluidic system for point-of-care diagnostics.

According to an aspect of the present invention, a fluid cartridge comprises a channel layer within which at least one circumferentially sealed fluid channel is formed. The channel layer comprises a substrate and an elastic layer fixedly arranged on the substrate, wherein the substrate has a rigidity being greater than that of the elastic layer. The at least one fluid channel is defined on at least one side thereof by the elastic layer. For example, the elastic layer and the substrate are bonded together by gluing. For example, the rigidity of the substrate relative to the elastic layer can be adjusted via the material of the substrate or via a mechanical constraint. For example, the rigidity of the substrate relative to the elastic layer may be adjusted via the thickness of the substrate and/or of the elastic layer or by inserting one or more elements for adjusting the rigidity into the substrate, for example one or more ribs. The at least one fluid channel can have any suitable cross-section. For example, the at least one fluid channel has a rectangular or circular cross-section. The cross-section of the fluid channel may also vary along the length of the fluid channel but this does not have to be the case. Circumferentially sealed means that the fluid channel is completely surrounded by the channel layer, that is, the fluid channel is circumferentially closed/sealed and not open to one side thereof so that a fluid can be accommodated and stored therein without leaking or escaping from the fluid channel. Since at least a portion or side of the fluid channel is defined by the elastic layer, the fluid channel may be compressed by depressing the elastic layer. The fluid cartridge according to the present invention is easy and inexpensive to manufacture. Therefore, a set of disposable different fluid cartridges may be provided, wherein each fluid cartridge is provided for a different assay. Depending on the desired assay to be performed the respective fluid cartridge (assay-specific or application-specific cartridge) may then be used in the pump according to the present invention and may be disposed afterwards and replaced by another fluid cartridge.

According to an embodiment, the fluid channel can be exclusively formed within the elastic layer, that is, beneath the upper surface thereof and above the lower surface thereof. That is, all sides of the at least one fluid channel are defined/limited by the elastic layer. In this embodiment, the substrate does not take part in forming and limiting the fluid channel. For example, in this embodiment, the fluid channel can be formed by extruding the elastic layer in the desired shape or by providing a hole in the elastic layer, for example, by drilling. According to another example, the fluid channel may be formed within the elastic layer by providing a groove on a surface of a first elastic layer and by covering the surface comprising the groove with a second elastic layer. For example, the groove may be provided by machining the elastic layer, by extruding the elastic layer or by moulding, for example replica moulding (or soft-lithography), the elastic layer in a desired shape.

According to another embodiment, the at least one fluid channel can be defined on at least one side thereof by the substrate. That is, the at least one fluid channel is not limited by only the elastic layer but also by the substrate. For example, the fluid channel can be partly formed within the elastic layer and partly formed within the substrate. In this case, the upper side/part of the channel is defined/limited by the elastic layer, wherein the lower side/part of the channel is defined by the substrate, and wherein the lateral sides/parts of the fluid channel are defined/limited by both the elastic layer and the substrate. In other words, in this example, the fluid channel is formed by two mating grooves, wherein one groove is formed on the lower surface of the elastic layer, and wherein the other groove is formed on the upper surface of the substrate. According to another example of this embodiment, only the lower side/part of the fluid channel is limited/defined by the substrate, wherein all other sides/parts are limited by the elastic layer. In other words, in this example, the fluid channel is formed by a groove provided on the lower surface of the elastic layer, wherein the groove is covered/sealed with the substrate. According to yet another example of this embodiment, only the upper side of the fluid channel is limited by the elastic layer, wherein the other sides are limited by the substrate. In other words, in this example, the fluid channel is formed by a groove provided on the upper surface of the substrate, which is covered/sealed with the elastic layer. In any of the examples of this embodiment, if a groove is to be provided in the elastic layer, the groove can be formed by machining the elastic layer, by suitably extruding the elastic layer or by suitably moulding the elastic layer. If a groove is to be provided in the substrate, the groove can be formed by machining, etching, extruding, or moulding the substrate layer.

In any of the above embodiments, the elastic layer may comprise an elastomer which, for example, can be selected from the group consisting of a silicone elastomer, for example polydimethylsiloxane (PDMS), polyisoprene, polychloroprene, natural rubber, latex, butyl rubber, ethylene propylene rubber, Polyether block Amide, polybutadiene, polyurethane, perfluoro polymers, for example perfluoropolyether (PFPE) elastomer, polyimide, parylene, and ethyl-vinyl acetate. The elastic layer can be made of a single material or can be made of a mixture of different materials. The elastic layer may also be a composite layer.

In any of the above embodiments, the substrate may have a substantially planar upper surface, wherein the lower surface of the elastic layer is arranged on said planar upper surface of the substrate and faces said planar upper surface of the substrate.

In any of the above embodiments, the substrate may be provided as a plate. For example, the plate can have a round shape, for example a circular shape, a rectangular shape or the shape of a polygon. For example, the elastic layer and the substrate can have the same or a similar shape but this does not have to be the case. Also the substrate can be made of a single material or can be made of a mixture of different materials. The substrate may also be a composite layer.

In any of the above embodiments, the substrate may be made of an electrically/magnetically inert material that does not behave as a magnetic shield. For example, the electrically/magnetically inert material can be silicon or glass. According to another example, the electrically/magnetically inert material can be an organic polymeric material or an inorganic ceramic material. For example, the polymeric material can be selected from the group consisting of an acrylic polymer, for example polymethylmethacrylate (PMMA) or methylmethacrylate (MMA), polycarbonate, cyclic olefin copolymer (COC) and polystyrene. When the fluid cartridge is used in the pump or in the fluid valve arrangement according to the present invention which respectively can comprise a magnetisable pressing element and a magnetic field device, the substrate made of one or more of the above materials does not affect the magnetic field/interfere with the magnetic field acting on the pressing element. Of course, also the elastic layer should not affect the magnetic field/interfere with the magnetic field that acts on the pressing element.

In any of the above embodiments, at least a portion of the at least one fluid channel can longitudinally extend within the channel layer in the shape of a circular arc. In other words, the footprint of the fluid channel layer may have the shape of a circular arc.

In any of the above embodiments, at least a portion of the at least one fluid channel can longitudinally extend within the channel layer in a spiral shape. Thereby, the available space in the channel layer can be effectively used thereby reducing the overall size of the cartridge and increasing compactness thereof.

In any of the forgoing embodiments, at least a portion of the at least one fluid channel can have a meander shaped footprint. Similar to the spiral shape this has the effect that a high percentage of the available space in the channel layer can be utilized for accommodating one or more fluids therein thereby reducing the overall size of the cartridge and increasing compactness thereof. Both the spiral shape/footprint and the meander shape/footprint are suitable for storing a plurality of different fluids in only one fluid channel. However, it is also possible to only store a single fluid in the at least one fluid channel.

In any of the above embodiments, a microfluidic chip can be provided in or on the channel layer so as to be in fluid connection with the at least one fluid channel. For example, the microfluidic chip can be provided in or on the elastic layer. However, the chip may also be provided in or on the substrate layer. For example, the microfluidic chip can be a silicon-based microfluidic chip for extraction of a chemical or biological substance from a fluid comprising the chemical or biological substance and for purification of the chemical or biological substance. For example, the microfluidic chip can be directly integrated into the channel layer, for example in the elastic layer. Any microfluidic chip known in the art can be used in the present invention. Illustrative examples of such a microfluidic chip include, but are not limited to, the microfluidic chips described in WO 2005/066343, U.S. Pat. No. 6,368,871, U.S. Pat. No. 6,379,626, or Kim et al., Proc. Of the IEEE Conference on MEMS, 2002, 15, pages 133-166, for example. However, the microfluidic chip can also be provided separately from the channel layer. In this case, for example, the microfluidic chip may be attached to the elastic layer, for example by bonding (for example, by means of a double-sided adhesive tape), and connected to the fluid channel via a fluidic port provided in the channel layer. According to another example, a cavity may be provided in the elastic layer and/or in a rigid covering layer arranged on top of the elastic into which the microfluidic chip may be inserted. For example, the microfluidic chip can be designed for nucleic acid extraction and purification from a whole blood or bodily (physiological) sample. For example, the microfluidic chip can be designed for performing immunoassay on a physiological sample. The microfluidic chip may have one or more inlets and one or more outlets. The microfluidic chip may also integrate several functionalities such as cell trapping, cell lyses and nucleic acid purification. The microfluidic chip can be designed to perform one or more microfluidic operations such as mixing, filtration, extraction, etc.

In any of the above embodiments, a covering layer having a rigidity being greater than that of the elastic layer may be provided on top of the elastic layer. For example, the relatively rigid covering layer may be arranged on the elastic layer via any available bonding method. By providing a covering layer on top of the elastic layer any undesired expansion of the elastic layer in places other than those defining/surrounding the fluid pump channel can be suppressed. Further, any fluidic discharge through the potentially gas-permeable elastic layer can be prevented, such as a discharge of separating fluid (for example, gas charge/plug), thereby preventing possible cross-contamination of reagents stored within the elastic layer with the loss of separating fluid. Further, a guiding (orbital) channel for accommodating and guiding one or more pressing elements therein can be formed within the covering layer. In this case, the pressing element(s) of the pump may be supplied together with the cartridge and may be discarded with the cartridge after usage of the same.

In any of the above embodiments, one or more fluid storage containers and/or one or more fluid storage lines can be arranged in or on the channel layer (for example, in or on the elastic layer) so as to be in fluid connection with the at least one fluid channel. For example, the one or more fluid storage containers and/or the one or more fluid storage lines are non-integrally formed with regard to the channel layer, that is, the fluid storage lines/containers and the elastic layer/channel layer are not formed as one part, and are removably and/or replaceably arranged in or on the channel layer. For example, the one or more fluid storage containers and/or one or more fluid storage lines are pluggable into and unpluggable out of the elastic layer/channel layer. The one or more fluid containers and/or the one or more fluid storage lines are used and designed for accommodating fluids therein and are in fluid connection with the at least one fluid channel so as to receive a fluid (educt, product) from the fluid channel and collect it in the container/line and/or to release a fluid (educt, reagent, sample) from the container/line into the fluid channel. The fluid storage containers and fluid storage lines allow for a more modular design of the fluid cartridge thereby increasing flexibility thereof, and further allow for increasing storage capacity by introducing a third dimension for fluid storage in addition to the planar quasi-2D channel layer. For example, the fluid storage line is a tube being bent or bendable into a substantial U-shape and/or helical shape. For example, the containers are formed in a box shape with an inlet and an outlet port. By means of the containers/lines separate fluid channels may be connected with each other in any desired form/combination. For example, a fluid storage container can be mounted on the channel layer so as to bridge two disconnected (segregated) planar fluid channels in the cartridge. For example, at least two fluid storage containers/lines can be mounted in "series" meaning both containers/lines bridge a same isolated single channel or chamber to other channels within the cartridge. For example, at least two fluid storage containers/lines can be mounted in "parallel" meaning both source from the same fluid channel and/or both terminate at the same fluid channel (there could be other configurations of "parallel" mounting storage containers/lines including all possible combinations of pairing their source and termination channels within the cartridge). It is also possible that two or more fluid storage containers and/or two or more fluid storage lines branch of from the same fluid channel. It is also possible that two (or more) fluid storage containers and/or two or more fluid storage lines are arranged in the channel layer so as to source from a different fluid channels and terminate at another same fluid channel.

According to another embodiment, two separate fluid channels can be connected via a dummy, that is, a dummy container or a dummy line, wherein the dummy is replaced by a fluid storage container/line comprising a sample therein before usage of the cartridge/pump. The dummy can be used to keep the cartridge/fluid channel closed/blocked until the user replaces it with a new line/container that contains the sample to be analyzed/processed.

According to another embodiment, a plurality of fluid storage containers and/or fluid storage lines can be provided in or on the channel layer and connected in series via at least one fluid channel, with a microfluidic chip being connected therebetween. In this embodiment, a number of containers/lines is arranged before the chip and a number of containers/lines is arranged after the chip. The containers/lines arranged before the chip respectively contain therein a reagent or a sample. The containers/lines arranged behind the chip may be empty. During operation of the pump the reagents and sample(s) are pumped through the chip and are collected in the containers/lines arranged after the chip. After operation of the pump the corresponding container/line having the product therein may be removed from the cartridge. For example, the at least one fluid channel can be formed in a closed loop of two substantially concentric circular arc portions which are connected with each other at their respective ends.

In any of the above embodiments, a plurality of different fluids may be stored within a single fluid channel, wherein the different fluids are arranged in series and are separated from each other. For example, the different fluids can be separated from each other by a separating fluid being immiscible with the adjacent fluids. For example, the separating fluid is an inert gas, for example a noble gas, nitrogen or carbon dioxide, or an air charge or a liquid which has very low solubility or is immiscible with regard to the adjacent fluids. However, alternatively the different fluids may also be separated by a thin wall which breaks when the fluid in the fluid channel is pressurized. According to this embodiment, it is possible to store within only one fluid channel a plurality of different fluids thereby providing a simple but nevertheless efficient cartridge structure, wherein contamination and blending of the respective fluid with an adjacent fluid can be reliably prevented. For example, several reagents (washing solution, buffer solution, etc.) may be stored in the fluid channel, which are required for a certain assay performed on an LOC being in fluid connection with one end of the fluid channel, such that when the fluid channel is pressurized the reagents enter the LOC in the order/sequence in which they are stored in the fluid channel. Thus, in this example, the reagents are stored in the fluid channel in their order of use and in the corresponding volume required in the assay for which the fluid cartridge is designed.

In the above embodiment, the single fluid channel can be connected to an inlet of a microfluidic chip at one side thereof, and a working liquid can be stored in the single fluid channel between the other side thereof and the plurality of different fluids. For example, the working liquid can be inert with regard to the channel layer and the chip and does not contain any gas therein. For example, the working liquid and the plurality of different fluids can be separated from each other by an immiscible separating fluid. If a working liquid/pumping liquid is stored behind the different fluids, the different fluids can be indirectly pushed into the chip by pressurized working liquid. Thus, the pumping channel can be kept free of the different fluids (sample, reagents, etc.), and a proper liquid can be used for creating the pressure required to push the different fluids into the chip. For example, the one end of the single fluid channel can be indirectly fluid-connected to the microfluidic chip via another fluid channel serving as a chip inlet channel which is connected to the single fluid channel via a dummy which can be replaced by a fluid storage container/line containing a sample therein before the cartridge/pump is operated. For example, the other end of the single fluid channel can be in indirect fluid connection with an outlet of the chip via yet another fluid channel serving as a chip outlet channel which is connected to the other end of the single fluid channel via a removable fluid storage container/line which contains therein the product at the completion of the cartridge/pump operation.

According to another embodiment, a plurality of separate fluid channels can be formed within the channel layer. For example, a different fluid can be stored in each of the plurality of fluid channels. Further, it is also possible to store in one or more of the plurality of fluid channels a sequence of different fluids as described above. For example, each of the plurality of fluid channels may comprise a circular arc portion, each of said circular arc portions having the same radius, and the circular arc portions of the plurality of fluid channels being arranged along a same circular path. In this example, an end portion of each of the plurality of fluid channels may be arranged within the circular path, wherein an LOC-chip can be provided within the circular path and in fluid connection with one end of each of the plurality of fluid channels. For example, the other end portion of each of the plurality of fluid channels substantially comprises a meander shaped portion. If each fluid channel substantially comprises a meander shaped portion, a large amount of fluid may be stored in the respective fluid channel. If an end portion of each of the plurality of fluid channels is arranged within the circular path, a device for carrying out an assay, such as a microchip for carrying out a bioassay, can be simply placed inside of the circular path and can be fluid-connected with the respective end portion. If each of the plurality of fluid channels comprises a circular arc portion, each circular arc portion has the same radius and the circular arc portions are arranged along a same circular path, the fluids stored in the different fluid channels can be delivered to an assay device placed inside of the circular path quasi-simultaneously by moving a pressing element along the circular path for several revolutions thereby squeezing the fluid channel. Further, it is also possible to deliver/pump the fluids stored in the different fluid channels simultaneously by providing multiple pressing elements with each pressing element being dedicated to a given arc channel at a time.

According to another embodiment of the invention, a plurality of separate fluid channels can be formed within the channel layer, each of the plurality of fluid channels comprising a circular arc portion, each of said circular arc portions having the same radius, and the circular arc portions of the plurality of fluid channels being arranged along a same circular path, an end portion of each of the plurality of fluid channels being arranged within the circular path and fluid-connected to an LOC-chip, wherein at least one of the end portions arranged within the circular path is connected to the corresponding inlet of the chip via a separate fluid channel serving as a chip inlet channel which is connected to the at least one end portion via a dummy being replaceable by a fluid storage container/line containing a sample therein. For example, the other end portion of each of the plurality of fluid channels is fluid-connected to a separate outlet of the chip via a respective separate fluid channel serving as a chip outlet channel, the respective chip outlet channel being connected to the respective other end portion via a removable fluid storage container/line. Depending on the chip, the cartridge according to this embodiment can be used for performing multiple assays with a single cartridge in parallel or can be used for performing a single assay which requires multiple inputs to the chip.

According to another embodiment, the at least one fluid channel is connected to an inlet of an LOC-chip at one end thereof, wherein one or more fluids are stored in the at least one fluid channel, and wherein a working liquid is stored in the at least one fluid channel between the other end thereof and the one or more fluids. This has the above described effect, that a suitable working liquid can be used in the fluid pump channel for creating the required pressure to push the different fluids into and out of the chip.

According to another embodiment, a plurality of circumferentially sealed channels or chambers can be formed within the channel layer, the fluid cartridge further comprising a plurality of fluid storage lines/containers connected in series via the plurality of channels or chambers and respectively comprising a different fluid therein, and a first and a last of the plurality of fluid storage lines/containers having a respective free end serving as a connection end, wherein one of the two connection ends is in fluid connection with a fluid channel containing a working liquid therein. In this embodiment, the fluids can be exclusively stored in the fluid storage lines/containers which are connected in series and can be fluid-connected on one side thereof to an assay device such as a microchip, wherein the other side thereof is in fluid connection with the fluid channel comprising the working liquid. In this case, the fluid channel having the working liquid therein can exclusively serve as a pumping channel through which a pumping fluid, for example deionised water, is pumped to thereby push the fluids stored in the fluid storage lines/containers forward and into the assay device. If the fluids are stored downstream of the pumping channel and only the pumping fluid is pumped through the fluid channel/pumping channel, the pumping fluid being free of air gaps or air bubbles, the flow rate is easier to control, less fluid contamination occurs, no fluids are wasted and higher backpressures can be achieved. For example, each chamber can be filled with a separating fluid, such as an inert gas, being immiscible with the fluid in the respective fluid storage line.

According to another aspect of the present invention, a pump comprises a fluid cartridge according to any of the above embodiments, wherein a fluid pump channel is formed by at least a portion of the at least one fluid channel of the fluid cartridge, and wherein the pump further comprises at least one pressing element, the at least one pressing element and the fluid cartridge being movable relative to each other, wherein by the at least one pressing element the elastic layer can be successively depressed along the fluid pump channel when the pressing element and the fluid cartridge are moved relative to each other to thereby compress a corresponding portion of the fluid pump channel, and a driving device by which the at least one pressing element and the cartridge can be pressed against each other to cause the at least one pressing element to depress the elastic layer, and by which the at least one pressing element and the cartridge can be moved relative to each other to cause the pressing element to relatively move along the fluid pump channel. For example, the pressing element is moved along the fluid pump channel to thereby compress a respective portion of the fluid pump channel. However, it also possible to alternatively rotate the cartridge while keeping the pressing element fixed. Further, it is also possible to move both the pressing element and the cartridge. For example, the pump according to the present invention can be used as a microfluidic pump for so called lab-on-chip applications. For example, the pump can be operated as a peristaltic pump. With the pump according to the present invention any interface tubing as required with systems having a separate pump and a separate fluid cartridge can be avoided. Due to the above design the pump according to the present invention may be made compact, is easy to manufacture and nevertheless operates in a reliable manner. For example, a disposable fluid cartridge can be used as the fluid cartridge, wherein the pressing element and the driving device are endurable parts of the pump. In this case, after the operation of the pump the pressing element is released from the elastic layer and the used fluid cartridge is disposed and replaced by another (fresh) cartridge. For example, the pressing element can be formed by one or more rolls or press shoes which are guided along and pressed against the fluid pump channel by the driving device.

According to an embodiment of the pump of the present invention, the pressing element can be magnetisable and the driving device can comprise a magnetic field device providing a moving magnetic field acting on the pressing element. The pump according to this embodiment is easy to manufacture, and the pressing element and the driving device operate almost wear-free. In the case of a disposable fluid cartridge, after the operation of the pump the magnet field acting on the magnetisable pressing element can be reduced or switched off by the magnetic field device thereby releasing the pressing element from the elastic layer so that the used fluid cartridge can be easily replaced by a fresh one. However, it is also possible to manually remove the pressing element by applying an external force to overcome the magnetic force. It is also possible that the pressing element can be sacrificed and disposed together with the cartridge by simply moving the cartridge away. In this case, the pressing element can be enclosed in the cartridge.

In any of the above embodiments of the pump according to this invention, the pressing element may be a round object, for example a ball. In the case of a disposable fluid cartridge, after the operation of the pump the ball may be simply elevated/removed from the elastic layer so that the used fluid cartridge can be replaced by a fresh one. During operation of the pump the ball is simply laid/placed on the upper surface of the elastic layer and is rolled thereon along the fluid channel formed within the channel layer, wherein rolling/movement of the ball is controlled by the driving device. Thus, the ball successively depresses the fluid pump channel to thereby compress a respective portion of the fluid pump channel, whereby the fluid in the fluid pump channel is displaced. To vary the amount of fluid displaced by the ball the force applied on the elastic layer by the ball and/or the velocity of the ball may be varied. The size of the ball depends on the size/cross-section of the fluid channel and is selected appropriately.

In any of the above embodiments of the pump according to the present invention, at least a portion of the fluid pump channel can have the shape of a circular arc. In this embodiment, the pressing element may be simply moved in/along a circle having the same diameter as the circular arc portion of the fluid pump channel so that during each cycle (=one complete circulation along the circle) the pressing element successively depresses the fluid pump channel, thereby displacing fluid from one end of the fluid pump channel to the other end of the fluid pump channel. According to an example of this embodiment, the driving device can comprise a rotary element provided above or beneath the fluid cartridge, on which a magnet (permanent magnet or electromagnet) is eccentrically placed which is rotated along a circumferential path substantially coincident with the circular arc portion of the fluid pump channel when the rotary element is rotated. For example, the rotary element can be a rotary disk or a rotary bar. Thereby, provided that the pressing element is magnetisable, the pressing element can be easily moved along a circle by simply rotating the rotary element. For example, the magnet and the pressing element such as a magnetisable ball can be placed with each facing an opposite planar surface of the cartridge. To vary the force applied on the elastic layer by the pressing element the rotary element and the cartridge/substrate may be simply moved relative to each other in the axial direction of the rotary element, and to vary the velocity of the pressing element the rotational speed of the rotary element may be varied. Further, pumping efficiency (flow rate, pressure) can be also adjusted by adjusting compliance/elasticity of the elastic layer either by tailoring material properties of the elastomer and/or by properly choosing geometry of the fluid pump channel or thickness of the elastic layer.

However, it is also possible that the pump uses only direct contact force and no field force. In this case, for example, the elastic layer of the cartridge and the pressing element may be held/pressed against each other by a mechanical constraint such as a clamp while the cartridge and/or the pressing element are moved relative to each other, for example by means of a rotating element. It is also possible to employ a combination of both contact and field forces.

In any of the above embodiments of the pump according to the present invention, a plurality of separate fluid pump channels may be formed within the channel layer, wherein each of the plurality of fluid pump channels comprises a circular arc portion, each of said circular arc portions having the same radius, and the circular arc portions of the plurality of pump channels being arranged along a same circular path, and wherein the driving device comprises a rotary disk provided above or beneath the fluid cartridge, on which a magnet (permanent magnet or electromagnet) is eccentrically placed which is rotated along a circumferential path substantially coincident with the circular path when the disk is rotated. In this embodiment, by moving the pressing element along the circular path along which the circular arc portions of the plurality of pump channels are arranged, during a single cycle of the pressing element the fluids respectively stored in the plurality of fluid pump channels can be successively displaced.

In the above embodiments, either a permanent magnet or an electromagnet can be used as the magnet. If an electromagnet is used as the magnet, the magnet may be simply turned off/on after/before operation of the pump. If a permanent magnet is used as the magnet, a magnetic shield may be placed between the magnet and the pressing element after operation of the pump and may be removed therefrom before operation of the pump. In addition or alternatively, the distance between the magnet and the pressing element may be simply varied thereby reducing/increasing magnetic force acting on the pressing element.

In any of the above embodiments of the pump according to the present invention, the pump may comprise a plurality of pressing elements. Thereby, in the case of a single fluid pump channel, pump efficiency can be increased and a smooth/uniform operation of the pump can be achieved. In the case of multiple fluid pump channels, in addition to the above effects, the fluids stored in the different fluid pump channels can be pumped simultaneously. Further, in this embodiment, a plurality of magnets may be provided on the rotary element (corresponding to the plurality of pressing elements).

In any of the above embodiments of the pump according to the present invention, the driving device can be at least partly provided as a handheld system to run the pump. For example, the handheld system can control or adjust the velocity of the pressing element based on the sequence of fluids stored in the fluid channel(s). Thus, the handheld system may be used to control the flow rate of input sample(s) and each reagent. For example, the handheld system can be programmable and can execute a set of downloaded instructions to control the duration and rate of speed of the pressing element according to the sample(s) and reagents and specific protocol given. For example, the handheld system can provide an energy input to the pump in order to power active components provided within the cartridge. Such components may include a heater, a sensor, a diode, an electrical circuit, optics, a laser, an actuators etc. For example, the handheld system can display a status of a protocol (e.g. step 1, step 2, . . . , or depending on the application it can be more informative, for instance, Cell lysis step, Nucleic acid binding step, Wash step, Elution step, Nucleic acid amplification step, Detection step . . . ) and/or can display the results of an analysis or a process performed by an LOC provided on the cartridge.

According to another embodiment of the pump according to the present invention, a relatively rigid/stiff covering layer can be provided on top of the elastic layer. For example, a guiding channel can be formed in the covering layer in which the at least one pressing element is accommodated. Thereby, as stated above, any undesired expansion/deformation of the elastic layer and any gas/air leakage through the elastic layer can be prevented. In this embodiment, after operation/usage of the pump/cartridge, the pressing element is discarded together with the cartridge.

According to another aspect of the present invention, a fluid valve arrangement comprises a channel layer within which at least one circumferentially sealed fluid channel is formed, the channel layer comprising a substrate, and an elastic layer fixedly arranged on the substrate, wherein the substrate has a rigidity being greater than that of the elastic layer, and wherein the at least one fluid channel is defined on at least one side thereof by the elastic layer, the fluid valve arrangement further comprising a pressing element by which the elastic layer can be depressed at least at a position along the fluid channel to thereby close, that is, completely or partially constrict, the fluid channel, and a driving device by which the pressing element and the elastic layer can be pressed against and released from each other. Any of the above described embodiments of the fluid cartridge can be used in the fluid valve arrangement according to the present invention.

According to an embodiment of the fluid valve arrangement according to the present invention, the pressing element can be magnetisable, and the driving device can be a controllable magnetic field device for providing a magnetic field controllably acting on the pressing element in a manner to cause the pressing element to depress or to release the elastic layer.

In any of the above embodiments of the fluid valve arrangement according to the present invention, the pressing element may be a round object, for example a ball.

In any of the above embodiments of the fluid valve arrangement, the substrate may be made of a non-magnetisable material that does not act as a magnetic shield.

In the above embodiments of the fluid valve arrangement, the controllable magnetic field device may comprise an electromagnet or a permanent magnet. The electromagnet may be simply turned off/on to release/attract the pressing element thereby opening/closing the fluid channel. In the case of a permanent magnet, the magnet and the pressing element may be simply moved relative to each other to alter the force acting on the pressing element. Additionally or alternatively, the controllable magnetic field device may comprise a magnetic shield and a mechanism for placing the magnetic shield between the magnet and the pressing element and for removing the magnetic shield from therebetween. The controllable magnetic field device may also comprise a plurality of individually addressable magnetic shields, wherein the mechanism is capable of selectively placing one or more of the magnetic shields between the magnet and the at least one pressing element. If a plurality of pressing elements is provided, at least one separate magnetic shield can be provided for each pressing element.

According to another aspect of the present invention, a fluid cartridge comprises a substrate in which a plurality of circumferentially sealed chambers or channels is formed and a plurality of fluid storage devices non-integrally formed with respect to the substrate and connected in series via the plurality of chambers or channels, each fluid storage device comprising a different fluid therein, and a first and a last of the plurality of fluid storage devices having a respective free end serving as connection end. The substrate of the fluid cartridge according to this aspect of the invention may be either a flexible substrate or a rigid substrate. For example, the substrate of the fluid cartridge according to this aspect of the invention may be one of the substrate or elastic layer of the fluid cartridge according to the first aspect of the present invention described above. For example, one of the two free ends is connected with a pump such as the pump according to the present invention or any other suitable pump. For example, the other of the two free ends is connected to a microfluidic chip being located in or on the upper surface of the substrate. For example, the microfluidic chip can be a silicon-based microfluidic chip for extraction and purification of a chemical or biological substance from a fluid containing the chemical or biological substance. For example, each chamber can be filled with a fluid being immiscible with the fluids stored in the fluid storage devices.

Figure 7:
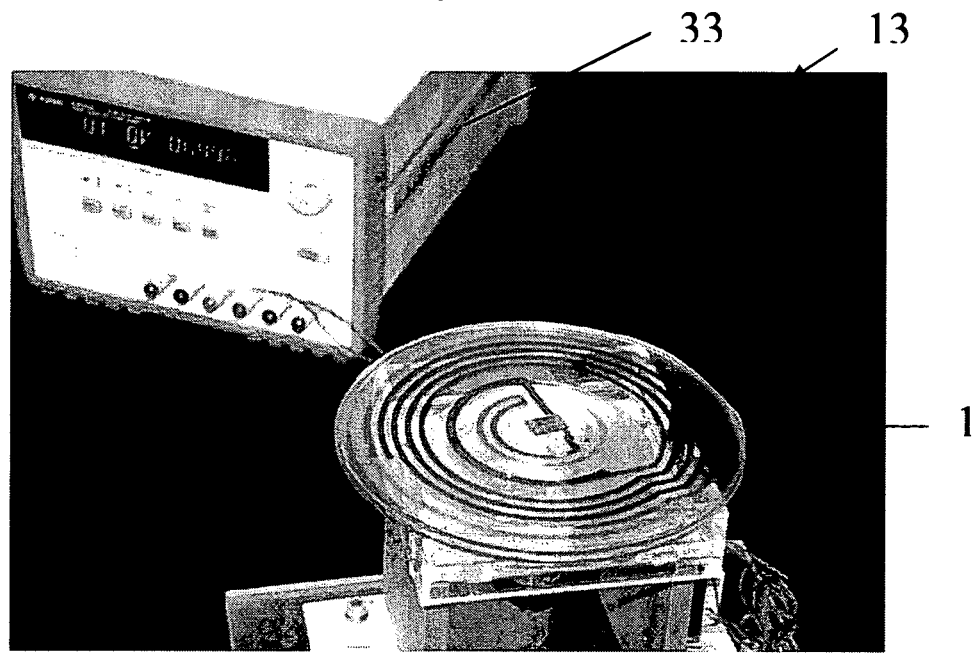
Figure 8:
Figure 9:
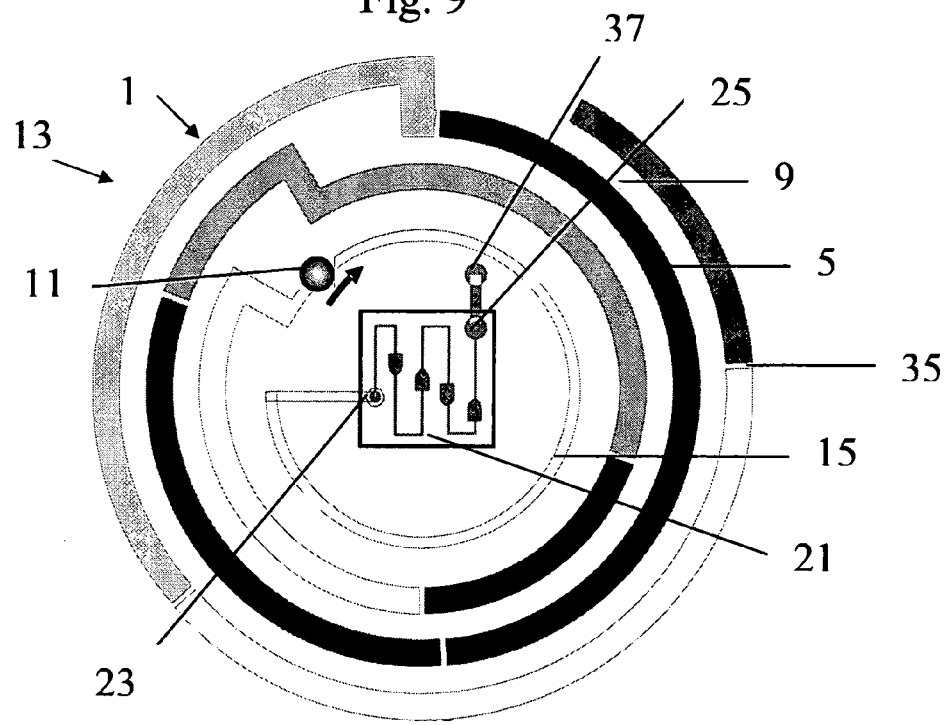
Figure 10:
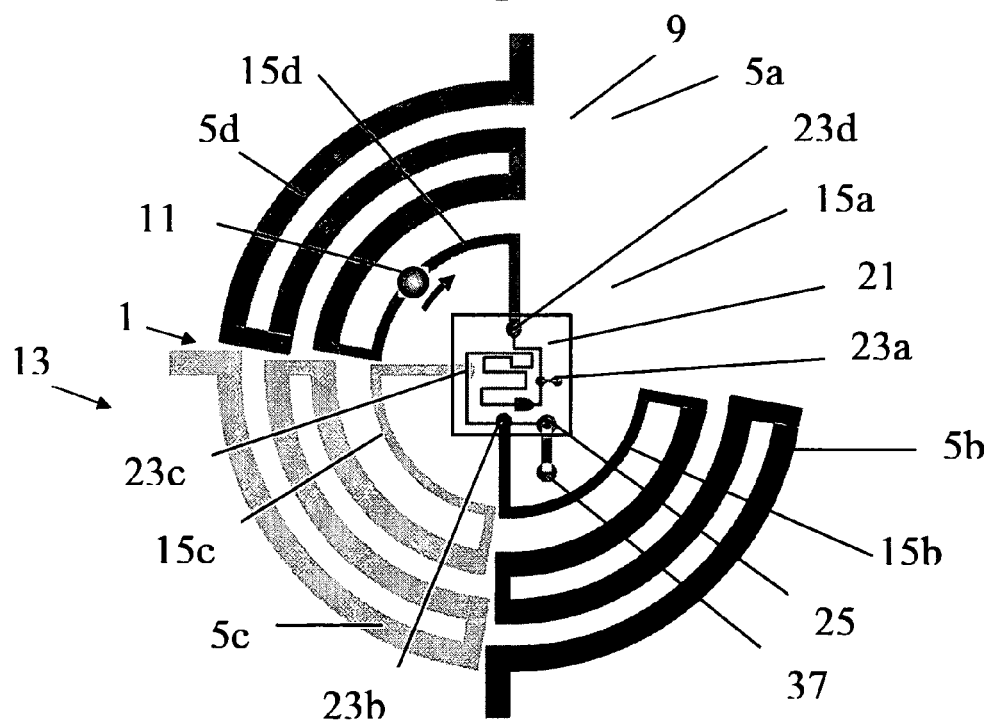
Figure 11A:
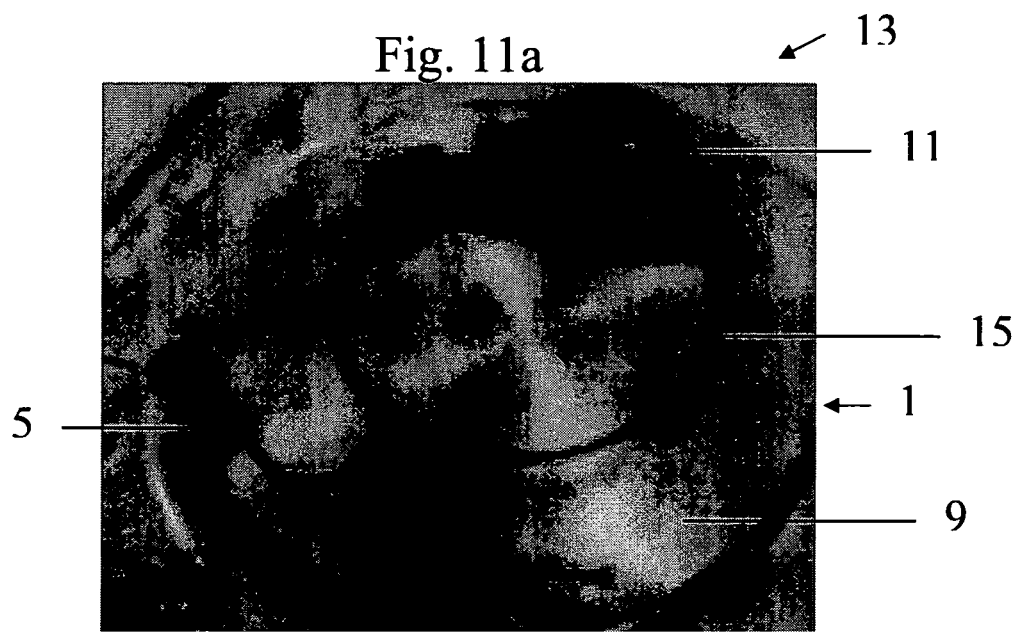
Figure 11B:
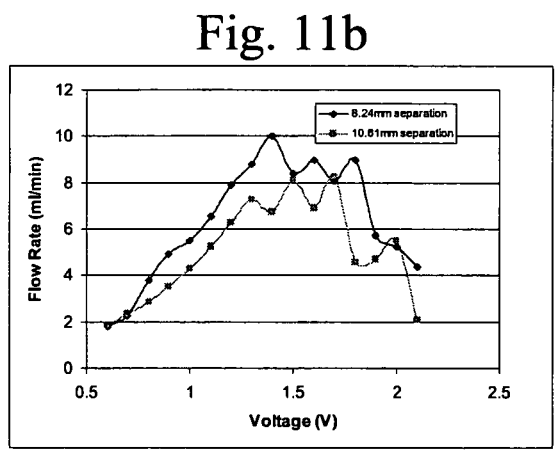
Figure 11C:
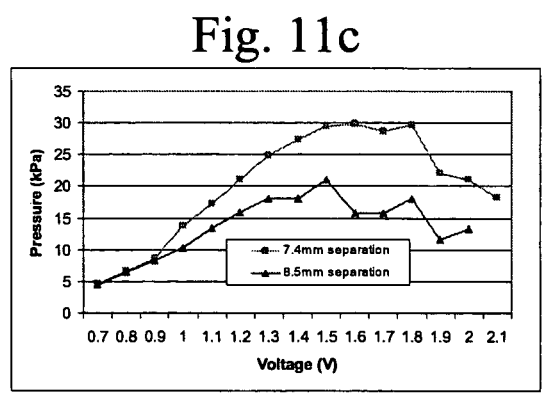
Figure 12:
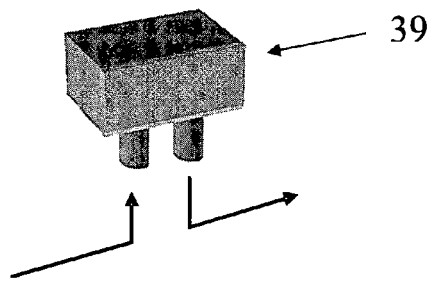
Figure 13:
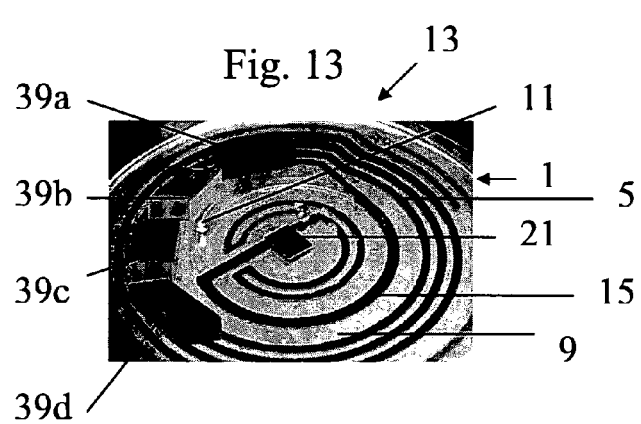
Figure 14:
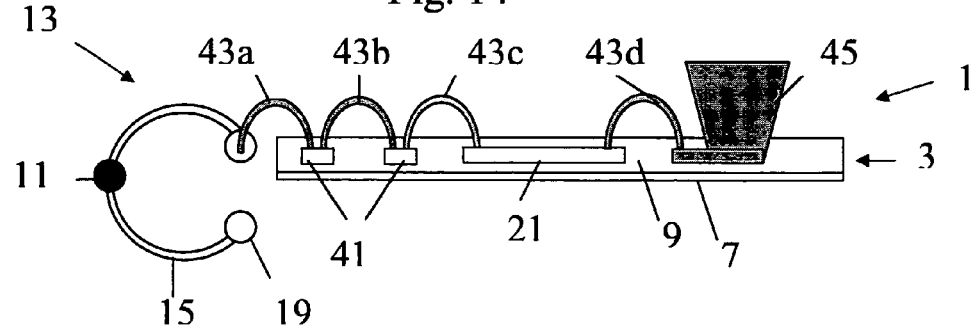
Figure 15:
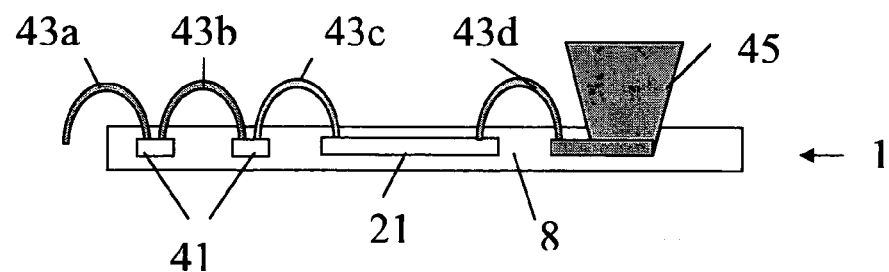
Figure 16:
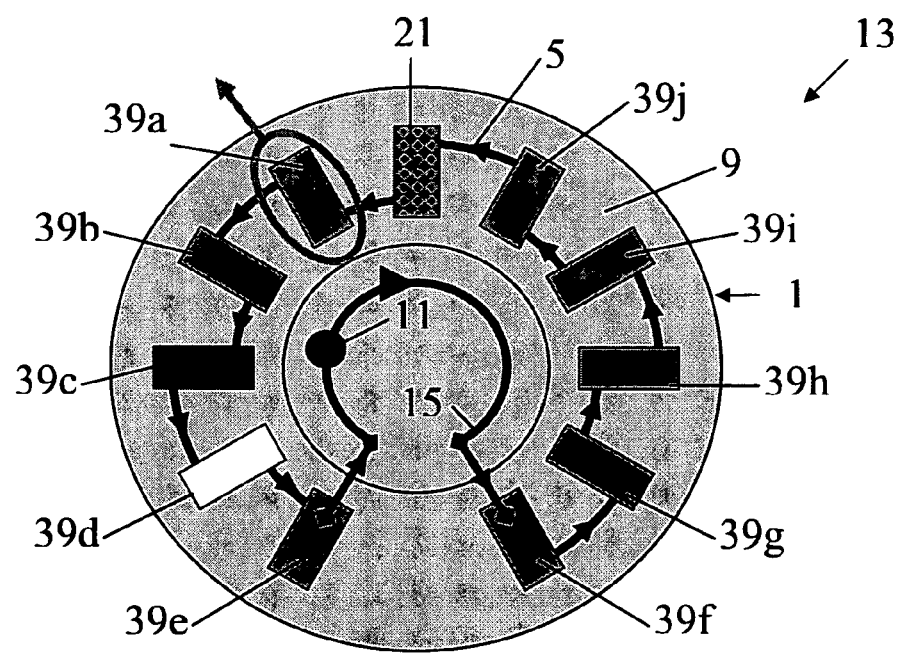

FIGS. 7 and 8 respectively show a general view of the pump according to a second embodiment of the present invention;

FIGS. 9 and 10 show a top view schematics on the pump according to a third and fourth embodiment of the present invention, respectively;

FIG. 11*a* shows a picture of a top view on the pump according to a fifth embodiment of the present invention, and FIGS. 11*b* and 11*c* show pump characteristics of the pump according to the fifth embodiment;

FIG. 12 shows a general view of a fluid storage container for usage in the fluid cartridge and/or the pump according to the present invention, and FIG. 13 shows several fluid storage containers being mounted to the elastic layer of the cartridge of the pump according to the second embodiment of the invention;

FIG. 14 illustrates the pump according to a sixth embodiment of the present invention;

FIG. 15 illustrates another embodiment of a fluid cartridge according to the present invention;

FIG. 16 shows a schematic top view on the pump according to a seventh embodiment of the present invention.

Figure 17:
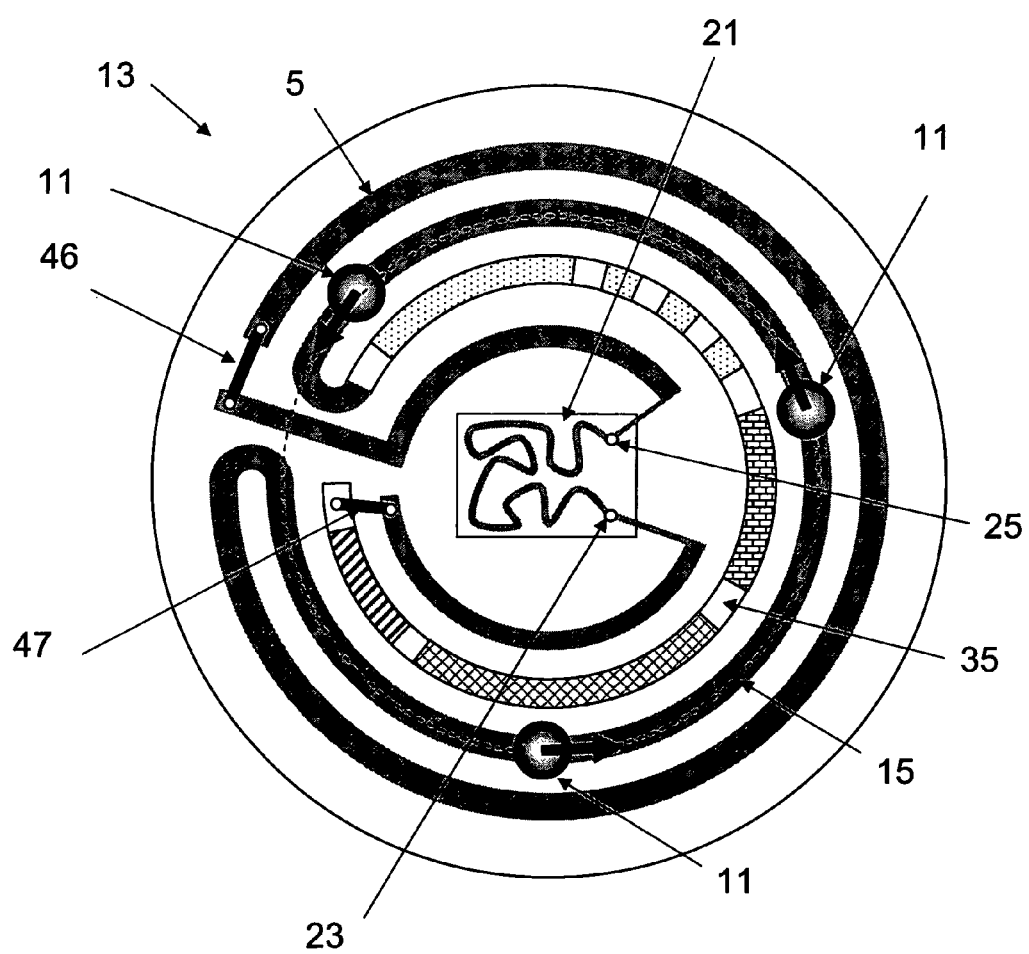
Figure 18:
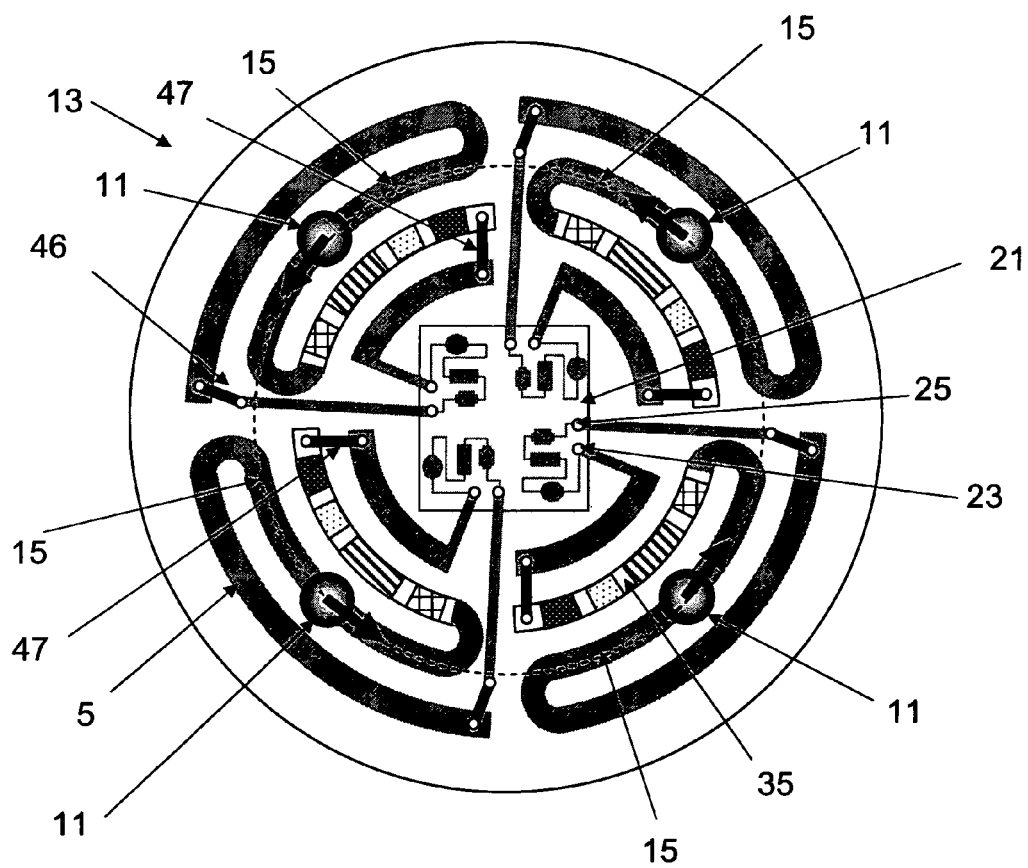
Figure 19:
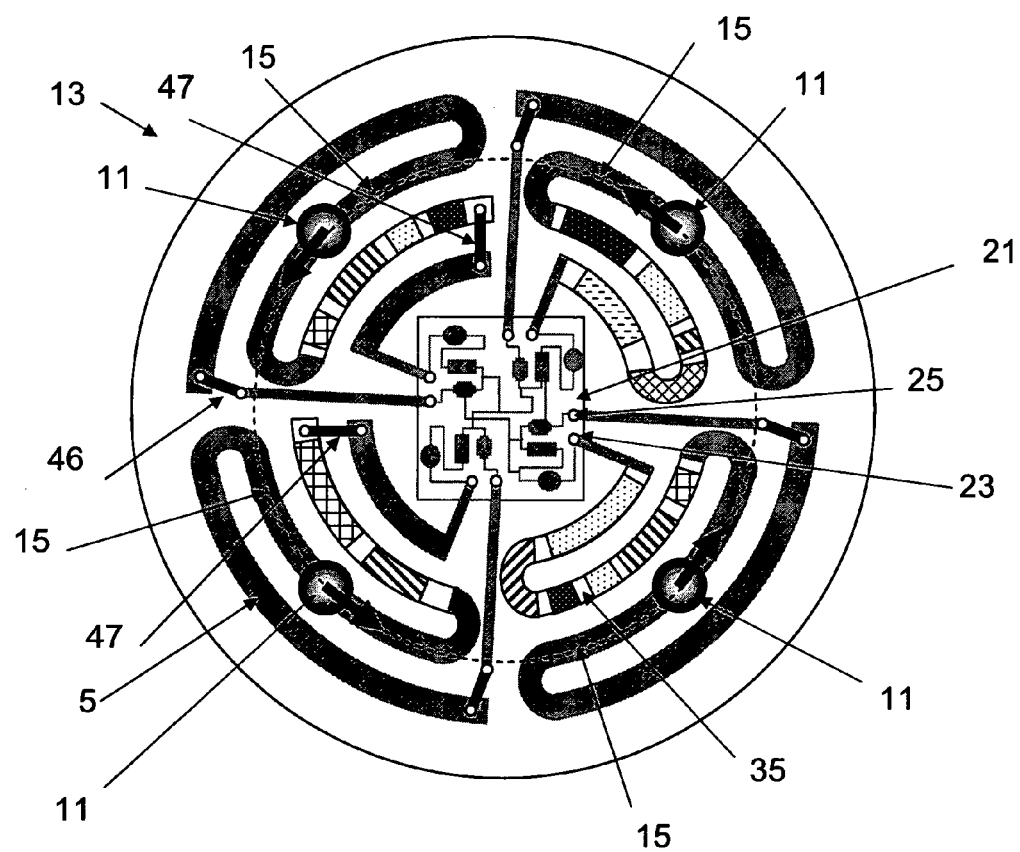
Figure 20:
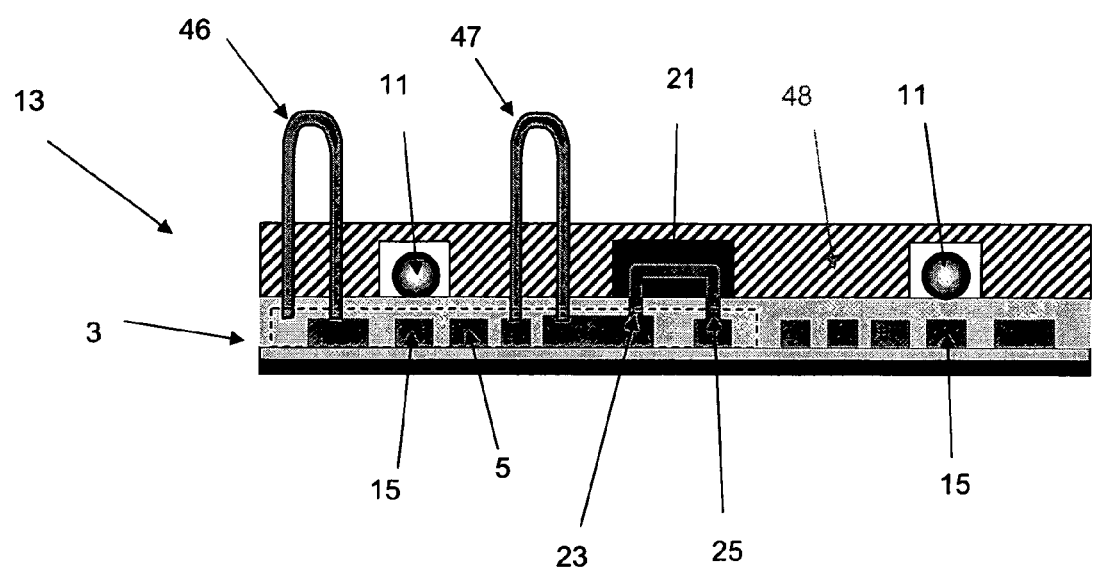

FIG. 17 shows a schematic top view on the pump according to an eighth embodiment of the present invention;

FIG. 18 shows a schematic top view on the pump according to a ninth embodiment of the present invention;

FIG. 19 shows a schematic top view on the pump according to a tenth embodiment of the present invention; and FIG. 20 shows a cross-section of the pump according to an eleventh embodiment of the present invention.

FIGS. 21*a* to 21*d* show different schematic top views on the pump according to a twelfth embodiment of the present invention.

FIGS. 22*a* to 22*f* show a method of fabricating fluidic channels utilizing tubings according to an embodiment of the present invention.

Figure 1:
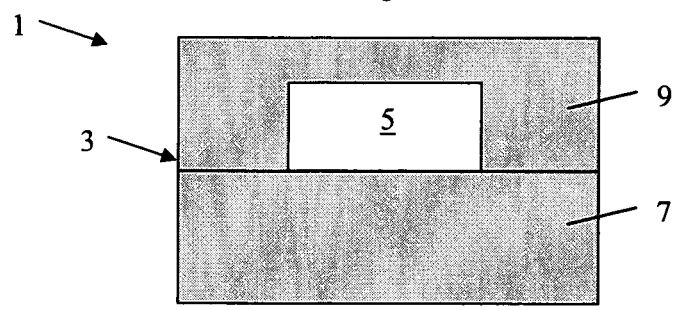
FIG. 1 shows a cross-section of the fluid cartridge according to a first embodiment of the present invention.

FIG. 1 shows a cross-section of the fluid cartridge according to a first embodiment of the present invention. The fluid cartridge 1 comprises a channel layer 3 within which at least one circumferentially sealed fluid channel 5 is formed. The channel layer 3 comprises a substrate 7 and an elastic layer 9 fixedly arranged on the substrate 7 by gluing or by any of the suitable bonding techniques such as thermal bonding or surface-activated bonding via oxygen plasma. According to this embodiment, the substrate 7 is made of an acrylic material in the form of a relatively thin stiff plate. Thus, the rigidity of the substrate 7 is greater than the rigidity of the elastic layer 9 thereby providing mechanical support to the elastic layer 9. The at least one fluid channel 5 is formed within the elastic layer 9 beneath the upper surface thereof and has a constant rectangular cross-section. The fluid channel 5 is surrounded on its upper side and lateral sides by the elastic layer 9 and on its lower side by the substrate 7, that is, the fluid channel 5 is circumferentially sealed so that a fluid can be accommodated and stored therein without leaking or escaping from the fluid channel 5 except through the longitudinal ends thereof. According to this embodiment, the elastic layer 9 is manufactured by replica-moulding polydimethylsiloxane (PDMS). The used mould is a relief structure defined in a 130 μm thick dicing or grinding tape (Lintec Corporation, Japan or Furukawa Electric, Co. Ltd, Japan). The thickness of the tape determines the depth of the channel 5 and the tape thicknesses can be accordingly selected from commercially available values. The tape is initially laminated on a polished surface of an 8-inch silicon wafer. A digitized negative image of the layout of the elastic layer 9 is transferred on the tape by thermal ablation via $CO_2$ laser (M-300 Laser Platform, Universal Laser Systems Inc. 30 W maximum beam power and 1905 mm/s maximum beam speed). The laser beam settings are adjusted (e.g. 1% of maximum beam power and 0.3% of maximum beam speed) such that the laser beam can cut through the tape without damaging the silicon substrate. Parts of the tape are then carefully removed from the layout. Then, the PDMS pre-polymer mixture at a ratio of 1:10 by weight is prepared, degassed, and then carefully poured on the mould. A ring barrier around the relief structure contains the pre-polymer mixture on the wafer. The mixture is cured on a leveled table at room temperature. After peeling from the mould, fluidic vias may be punched in the PDMS layer. The elastic layer 9 is then bonded to the stiff glass or silica-based (e.g. silicon wafer with silicon oxide coating) plate with the groove formed on the lower surface thereof facing the upper surface of the substrate 7, thereby forming the fluid channel 5.

Figure 2:
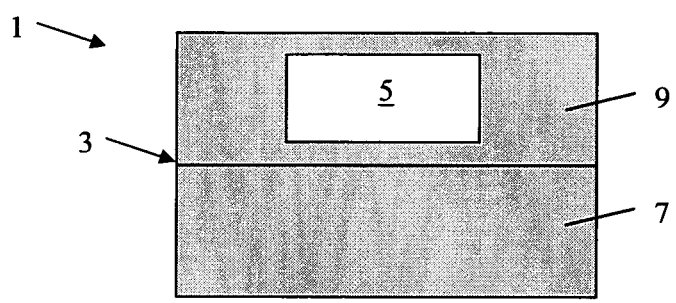
FIG. 2 shows a cross-section of the fluid cartridge according to a second embodiment of the present invention.
Figure 5:
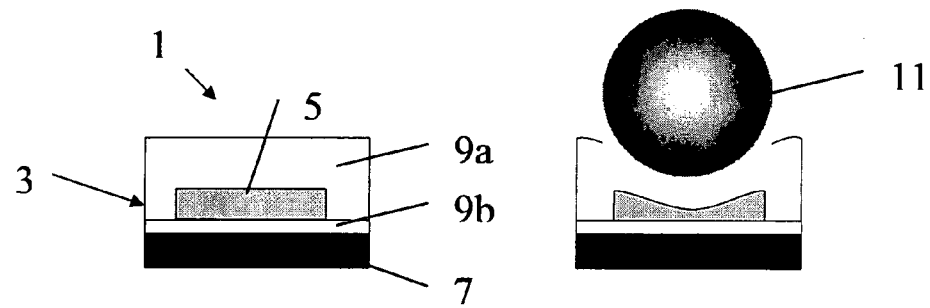
FIG. 5 shows a cross-section of the fluid cartridge according to the second embodiment of the present invention before and after the elastic layer of the fluid cartridge is depressed by a pressing element.

FIGS. 2 and 5 show a cross-section of the fluid cartridge according to the second embodiment of the present invention. According to this embodiment, the fluid channel 5 is formed within the elastic layer 9 beneath the upper surface thereof and above the lower surface thereof. That is, all sides of the fluid channel 5 are defined by the elastic layer 9. As shown in FIG. 5, in this embodiment, the elastic layer 9 consists of a first elastic layer 9*a* and a second elastic layer 9*b*. In the second embodiment, the substrate 7 is made of an acrylic material in the form of a relatively thin stiff plate. The first elastic layer 9*a* is manufactured by replica-moulding polydimethylsiloxane (PDMS). The used mould is the same as described above. However, after removing the first elastic layer 9*a* from the mould, the first elastic layer 9*a* is then bonded to the second elastic layer 9*b* which is another, flat PDMS layer after subjecting contact surfaces of both layers to oxygen-plasma treatment. Finally, the elastic layer 9 is placed on or adhesive-bonded to the stiff acrylic plate.

Figure 3:
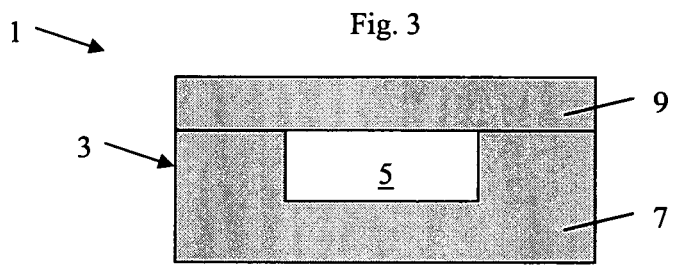
FIG. 3 shows a cross-section of the fluid cartridge according to a third embodiment of the present invention.

FIG. 3 shows a cross-section of the fluid cartridge according to a third embodiment of the present invention. The substrate 7 is again made of a glass or silica-based material in the form of a relatively thin stiff plate, and the elastic layer 9 is again made of polydimethylsiloxane (PDMS). According to this embodiment, only the upper side of the fluid channel 5 is surrounded by the elastic layer 9, wherein the other sides are limited by the substrate 7. According to this embodiment, the fluid channel 5 is formed by providing a groove on the upper surface of the substrate 7, for example by machining or selective etching, and by covering/sealing the groove with the elastic layer 9 thereby defining the fluid channel 5.

Figure 4:
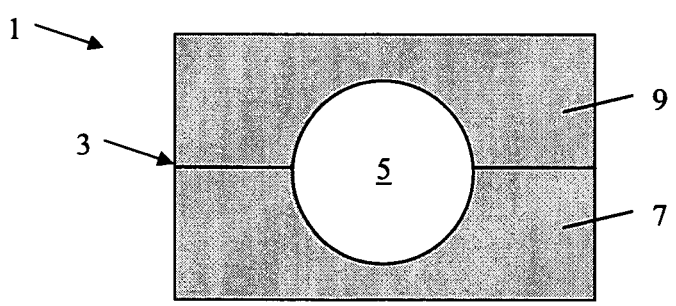
FIG. 4 shows a cross-section of the fluid cartridge according to a fourth embodiment of the present invention.

FIG. 4 shows a cross-section of the fluid cartridge according to a fourth embodiment of the present invention. In this embodiment, the fluid channel 5 has a constant circular cross-section. The substrate 7 is again made of a glass or silica-based material in the form of a relatively thin stiff plate, and the elastic layer 9 is again made of polydimethylsiloxane (PDMS). According to this embodiment, the fluid channel 5 is partly formed within the elastic layer 9 and partly formed within the substrate 7, that is, the upper side of the fluid channel 5 is defined by the elastic layer 9, wherein the lower side of the fluid channel 5 is defined by the substrate 7, and wherein the lateral sides of the fluid channel 5 are defined by both the elastic layer 9 and the substrate 7. According to this embodiment, the fluid channel 5 is formed by providing a groove on each of the upper surface of the substrate 7 and the lower surface of the elastic layer 9, for example by machining, selective etching, and replica-moulding etc. Afterwards, the elastic layer 9 is fixedly arranged on the substrate 7 so that the two grooves face and mate with each other thereby forming the fluid channel 5.

As can be seen in FIG. 5 of the drawings, since the fluid channel 5 is defined on at least one side thereof by the elastic layer 9, a portion of the fluid channel can be compressed by depressing the elastic layer 9 on the at least one side with a pressing element 11 such as a ball. Thus, if the pressing element 11 is pressed and moved on the elastic layer 9 along the fluid channel 5, fluid stored in the fluid channel can be displaced. FIG. 5 also illustrates the operation of a fluid valve arrangement according to the present invention.

Figure 6:
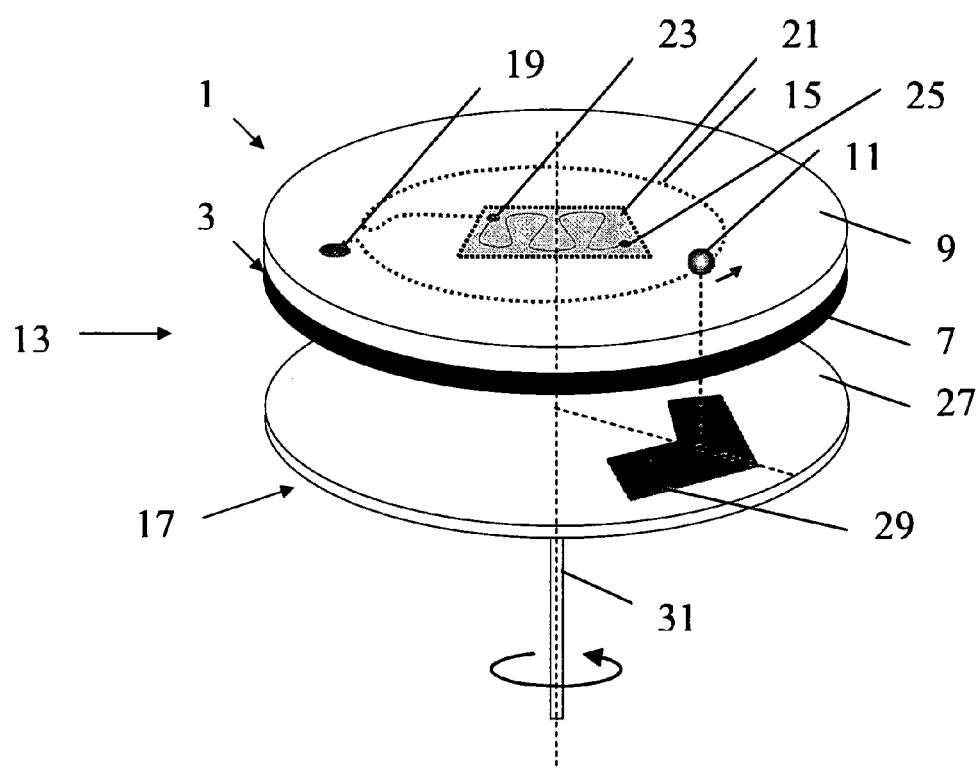
FIG. 6 shows a general view of the pump according to a first embodiment of the present invention.

FIG. 6 shows a general view of the pump according to a first embodiment of the present invention. The pump 13 comprises a fluid cartridge 1 according to one of the above embodiments. A fluid pump channel 15 is formed by at least a portion of the at least one fluid channel 5 of the fluid cartridge 1. The pump 13 further comprises a movable pressing element 11 and a driving device 17. By means of the pressing element 11 the elastic layer 9 can be successively depressed along the fluid pump channel 15 when the pressing element 11 is moved therealong to thereby compress a respective portion of the fluid pump channel 15. By means of the driving device 17 the pressing element 11 can be controlled, that is, controllably pressed against and moved along the fluid pump channel 15. According to this embodiment, the pressing element 11 is a steel ball, and the driving device 17 comprises a magnetic field device providing a moving magnetic field acting on the steel ball. The fluid pump channel 15 comprises a circular arc portion, and one of the two longitudinal ends of the fluid pump channel 15 is in fluid connection with a fluid via formed in the channel layer 3 and serving as a fluid pump channel inlet 19. The other one of the two longitudinal ends of the fluid pump channel 15 is in fluid connection with a microfluidic chip 21 which is integrated/buried in the elastic layer 9 and comprises a chip inlet 23 connected to the other end of the two longitudinal ends of the fluid pump channel 15 and a chip outlet 25. The fluid pump channel inlet 19 is in fluid connection with a fluid source comprising one or more reagents, samples, etc which are to be fed to the chip 21. The chip outlet 25 is connected to an output reservoir. The magnetic field device comprises a rotary disk 27 provided beneath the fluid cartridge 1, on which a magnet 29 is eccentrically placed which is rotated along a circumferential path substantially coincident with the circular arc portion of the fluid pump channel 15 when the disk 27 is rotated. In this embodiment, a strong rare-earth magnet made of neodymium ($Nd_2Fe_{14}B$) is utilized to generate an effective pumping power. For example, the rotary disk 27 is a circular 4-inch aluminium disk, and the magnet 29 is an arc-shaped/angled slab retrieved from a computer hard-disk drive (Western Digital) and securely off-centred on the 4-inch aluminium disk. The disk 27 is joined at the centre by a shaft 31 of a DC motor (MicroMotor 3042 from Faulhaber Germany). The radius of the fluid pump channel 15 dictates the orbit to be followed by the ball and hence sets the centre position of the magnet 29 with respect to the shaft centre. The fluid cartridge 1 is slightly elevated from the rotary disk 27, wherein the rotary disk 27 and the fluid cartridge 1 are moveable relative to each other in the axial direction of the rotary disk 27 to thereby adjust the distance between the ball and the magnet 29 and, thus, the force applied on the elastic layer 9 by the ball. For operating the pump 13 a cartridge 1 having a desired chip 21 integrated therein is selected from a set of different cartridges 1 and is placed above the rotary disk 27 by means of a fastener (not shown) with the centre of the fluid cartridge 1 being aligned with the centre of the rotary disk 27. Afterwards, the steel ball is laid onto the elastic layer 9 above the fluid pump channel 15. Then, the distance between the rotary disk 27 and the fluid cartridge 1 is adjusted by moving the rotary disk 27 up or down. The ball is attracted by the magnet 29 and, thus, squeezes a portion of the fluid pump channel 15 as shown in FIG. 5. Then, the rotary disk 27 is rotated via the shaft 31, wherein the rotational speed of the rotary disk 27 is set in accordance with the desired flow rate of the fluid in the fluid pump channel 15. When the rotary disk 27 is rotated, the ball follows the magnet 29 and, thus, sequentially depresses the fluid pump channel 15 thereby displacing fluid and feeding it from the fluid source into the chip 21.

FIGS. 7 and 8 show a general view of the pump according to a second embodiment of the present invention. According to the second embodiment, the pump 13 comprises a fluid cartridge 1 having a fluid channel 5 which spirally extends within the channel layer 3. On the centre of the fluid cartridge 1 a silicon-based microfluidic chip 21 is directly bonded on the elastic layer 9 using a double-sided adhesive tape. A dyed-water filling the fluid channel 5 emulate reagents typically used in diagnostic assays. A steel ball is again used as the pressing element 11 and is controlled by a driving device 17 which is similar to that of the previous embodiment. The rotary disk 27 of the driving device 17 is driven by a controller 33 which may be also provided as a handheld system. Via the controller 33 a user can adjust the rotational speed of the rotary disk 27. In this embodiment, the controller 33 is a power supply by means of which the user can manually change the applied voltage to thereby control rotational speed of the rotary disk 27 and, thus, flow rate of the pump 13. In this embodiment, the distance between the rotary disk 27 and the cartridge 1 is adjusted manually. In other embodiments the controller 33 may be designed to both control rotational speed of the disk 27 and distance between the disk 27 and the cartridge 1. However, in this embodiment the distance is not a variable for the user to adjust in order to reduce complexity of the system, but a guiding structure is provided with a special geometry that ensures a fixed pre-defined distance between the disk 27 and cartridge 1 when the user appropriately places a fresh cartridge as instructed. Both the pump 13 according to this embodiment and the pump 13 according to the above embodiment are suitable to be used as a self-contained system for point-of-care diagnostics.

FIG. 9 shows a top view of the pump according to a third embodiment of the present invention. The pump 13 according to the third embodiment comprises a fluid cartridge 1 having a single spiral-shaped fluid channel 5. Within the fluid channel 5 a plurality of different fluids (sample and reagents) is stored. The different fluids are segregated by a gas charge 35 (for example an air charge) or a liquid that is immiscible with the fluids used. This will prevent cross-contamination between the fluids. A microfluidic chip 21 having a single chip inlet 23 is placed on the centre of the fluid cartridge 1. The chip 21 is designed for an assay (for example heterogeneous immunoassay, or nucleic acid extraction and purification) which requires serial application of a sample and multiple reagents in a given sequence. Hence, the reagents are serially stored in the single fluid channel 5 according to their order of use and required volume in the bioassay. The pumping rate of each reagent can be independently defined by stepping up or stepping down the constant supply voltage to the rotary disk 27 when the corresponding reagent starts to enter into the pump channel 15. After flowing through the chip 21 the reagents are withdrawn via the chip outlet 25 which is connected to a fluidic port provided in the channel layer 3 and serving as a fluid cartridge outlet 37. The pump 13 according to the third embodiment of the present invention is one way of feeding one or more samples and multiple reagents required in an assay into the chip 21.

Another way of feeding one or more samples and multiple reagents into the chip 21 is shown in FIG. 10. Contrary to the pump of FIG. 9 which provides sequential introduction/feeding of multiple reagents in a given order, the pump according to the fourth embodiment of the invention provides quasiparallel/quasi-simultaneous introduction of multiple reagents (time-division-multiplexing). According to the fourth embodiment, each fluid (reagent, sample etc.) is pre-stored in a dedicated fluid channel 5a-5d, wherein by a portion of each fluid channel 5a-5d a (segmented) fluid pump channel 15a-15d is defined/formed. The fluid channels 5a-5d are partially formed in a substantial meander shape so as to increase capacity thereof. Each fluid pump channel 15a-15d comprises a circular arc portion, wherein the circular arc portions are arranged on a same circular path which corresponds to the orbit of the pressing element 11. In this embodiment, each fluid pump channel 15a-15d (and also each fluid channel 5a-5d) has the same length. In other words, in this embodiment, the fluid channel 5 (and the fluid pump channel 15) is divided into four equal segments, wherein each segment can be used only by a particular reagent or sample. However, in other embodiments the fluid pump channel 15 (and fluid channel 5) may be divided into unequal segments of two, three or more channels depending on flow rate and reagent requirements of the specific assay. In this embodiment, given a uniform angular speed of the steel ball at a constant supply voltage to the DC motor, all four reagents are pumped with an equal back pressure. Although adopting a non-uniform angular speed of the ball allows independent pumping pressure/flow rate for each reagent, this would require a sophisticated hardware for closed-loop control. Instead, the pumping pressure can be simply customized by accordingly adjusting the length and/or width of each fluid pump channel 15 during the design process. The chip 21 has a separate chip inlet 23a-23d for each fluid channel 5 and a single chip outlet 25 connected with the fluid cartridge outlet 37. Further, in this embodiment, it is possible to use a plurality of pressing elements (together with a plurality of magnets), for example 4 steel balls, so that the different reagents are simultaneously delivered to the chip 21.

In the above embodiments, for example, a silicon-based microfluidic chip for solid-phase extraction and purification of nucleic acid may be used as the chip 21. Solid-phase extraction of nucleic acid is based on the principle that nucleic acid readily but irreversibly binds to silica surface in the presence of chaotropic salts. After washing away impurities in an ethanol (or alcohol) solution, nucleic acid can be simply recovered from the surface by an elution in a low-salt buffer. Conventional procedures following this principle, however, are proven to be skill-laden and time consuming, involving many steps of pipetting and centrifuge. Microfluidic chips offer automation and miniaturization of these steps by eliminating pipetting steps of the reagents. We have earlier demonstrated that silica-based surface of the chips 21 can be utilized for the solid-phase extraction of nucleic acids (both genomic DNA and viral RNA). However, such chips can find use in the field outside research laboratories only when they are provided with a compact and easy-to-use pump with an established fluidic interface. Further, it is desirable to have a pump system incorporating a disposable fluid cartridge containing the required reagents for a specific bioanalytical assay. These problems can be solved by the fluid cartridge and the pump according to the present invention. The pump according to the present invention may be used as a universal platform for most bioanalytical assays by simply replacing the chip 21 or the whole fluid cartridge 1 so that the same pump 13 can function for different assays.

FIG. 11a shows a top view on the pump according to a fifth embodiment of the present invention which was used to determine typical pump characteristics of the pump according to the present invention. Pump characteristics such as flow rate and back pressure were measured against applied voltage at different separations (distance between centre of the ball 11 and top surface of the magnet 29) using dyed water. Further design parameters of the pump 13 according to the invention are wall thickness of the elastic layer 9, in particular the distance between the upper surface of the elastic layer 9 and the fluid pump channel 15, and depth of the fluid pump channel 15. Prior to each measurement, the fluid pump channel 15 was carefully primed with dyed water without introducing bubbles. Flow-rate measurements were obtained at a constant supply voltage by timing the pump to clear precise volume of dyed water from its inlet. Similarly, static pressure build-up across the pump was recorded by a digital pressure gauge (Fluke) at the pump outlet about a minute after applying a constant voltage supply. As can be seen from FIGS. 11b and 11c, maximum flow rate and maximum supply pressure generated by the pump 13 can easily reach up to tens of ml/min and tens of kPa, respectively. Both ranges of values are sufficient for most of the lab-on-a-chip and microfluidic applications. Besides, fairly low voltages (<1.5V) required for the pump 13 to generate such flow rates and pressures indicate that the unit is suitable for battery operation in the field.

FIG. 12 shows a general view of a fluid storage container 39 for usage in the fluid cartridge and/or pump according to the present invention. The fluid storage container 39 is suitable to store therein a product and/or waste leaving the chip 21 and/or sample(s) and reagents to be fed into the chip 21. As shown in FIG. 12, the fluid storage container 39 comprises a fluid inlet and a fluid outlet which may respectively be provided with a check valve. FIG. 13 shows several fluid storage containers 39a-39d being mounted to the elastic layer 9 of the fluid cartridge 1 of the pump 13 according to the second embodiment of the invention. Each fluid storage container 39a-39d is in fluid connection with the fluid channel 5 and accommodates a fluid/sample/reagent required in the assay performed by the chip 21. The fluid storage containers 39a-39d allow for a more compact and smaller footprint of the fluid cartridge 1/pump 13, since the reagents can be stored in reservoirs which take space also vertically but not only horizontally. In this approach, the fluid channel(s) 5 only/mainly forms the fluid pump channel 15 for generating peristaltic pumping action and functions as a fluidic interconnection between the chip 21 and other fluid storage containers 39. This approach also allows a more modular design whereby each reagent can be pre-stored in "fluidic blocks" which can be easily plugged in and plugged out to/from the channel layer 3, similar to components used in electronic industry.

According to the embodiment shown in FIG. 14, the pump 13 comprises a fluid cartridge 1 having a plurality of circumferentially sealed channels/chambers 41 formed within the elastic layer 9. Although the fluid pump channel 15 is shown outside of the channel layer 3 in FIG. 14 in order to keep a clear view, also in this embodiment the fluid pump channel 15 is formed within the channel layer 3. The pump according to this embodiment further comprises a plurality of fluid storage lines 43a-43c connected in series via the plurality of channels/chambers 41. Each fluid storage line 43a-43c comprises a different fluid therein, wherein a first and a last of the plurality of fluid storage lines 43a-43c have a respective free end serving as a connection end. One of the two connection ends is in fluid connection with the fluid pump channel 15, and the other one is connected to a chip 21. For example, line 43c may contain a priming fluid, line 43b may contain a sample fluid, and line 43a may contain one or more reagents. The fluid storage lines 43a-43c may be bendable or bent into a substantial U-shape or wound into a helical shape like a spring and may be directly plugged into the respective chamber 41 through the elastic layer 9. Each chamber 41 is filled with a separating fluid being immiscible with the fluid in the respective fluid storage line 43a-43c. Another fluid storage line 43d connects the outlet of the chip 21 with an output reservoir 45 provided on the elastic layer 9. With the pump 13 according to this embodiment, no air bubbles (or any other separating fluid) are introduced into the fluid pump channel 15, since the reagents being separated by the air gap segments are pre-stored after the fluid pump channel 15. The fluid pump channel 15 is initially primed with a neutral liquid (deionised (DI) water) without trapping air bubbles. The pump 13 uses this liquid (DI water) to drive the subsequent reagents into the chip 21. Bubbles within the fluid pump channel 15 adversely affect the pump performance in the following few ways. Bubbles are compressible. Hence the occupied volume in the fluid pump channel 15 is not constant. Bubbles can get trapped/stuck at the surface of the fluid pump channel 15. Bubble break-up can occur within the fluid pump channel 15 causing reagent mixing and contamination. Flow rate/pressure generated by the pump 13 is much lower in the presence of bubbles, and the bubbles cannot be calibrated, that is, the pump is difficult to calibrate, causing an indeterminable pressure/flow rate. All these problems can be solved by using a separate carrier fluid (DI water) in the fluid pump channel 15 with no air gaps therein to push the reagents (separated by air gaps) stored in the fluid storage lines 43 forward and into the chip 21. Thus, the pump according to this embodiment of the invention provides a more controllable flow rate, less cross contamination (reagent separation by air gap almost perfect), no reagent wastage, modular design, and higher backpressure due to the absence of bubbles in the fluid pump channel 15.

The above described concept of providing the reagents, sample(s), etc downstream of the fluid pump channel 15 and to use a separate carrier fluid in the fluid pump channel 15 may be also applied to the previous embodiments and is not limited to the usage of fluid storage lines 43. That is, also in the previous embodiments the fluid may be stored between the fluid pump channel 15 and the chip 21.

Further, as shown in FIG. 15, the above concept is not limited to the usage with a pump according to one of the previous embodiments. FIG. 15 shows a fluid cartridge according to another embodiment having a substrate layer 8 in which a plurality of circumferentially sealed channels/chambers 41 are formed. Pluralities of fluid storage lines 43a-43c which are non-integrally formed with respect to the substrate layer 8 are connected in series via the plurality of channels/chambers 41. Each channel/chamber 41 is filled with a fluid being immiscible with the fluids stored in the fluid storage lines 43a-43d. Each fluid storage line may comprise a different fluid therein (priming fluid, reagents, sample), wherein a first and a last of the plurality of fluid storage lines 43a-43c have a respective free end serving as connection end. One of the two connection ends is connected to a microfluidic chip 21 being located in or on the upper surface of the substrate layer 8. The other one of the two connection ends is to be connected to any suitable pumping device, for example, to a pump according to any of the above described embodiments.

FIG. 16 shows a top view on the pump according to a seventh embodiment of the present invention after carrying out an assay. The pump 13 comprises several fluid storage containers 39a-39j and a chip 21 which are arranged on the elastic layer 9 of the fluid cartridge 1 along a circle. The fluid channel 5 has the shape of a closed loop which is formed by connecting two substantially concentric circular arc portions with each other at their respective ends. The inner circular arc portion of the fluid channel 5 functions as the fluid pump channel 15, whereas the outer circular arc portion functions to connect the fluid storage containers 39a-39j and the chip 21 in series. According to this embodiment, upstream of the chip 21 and downstream of the fluid pump channel 15 are arranged fluid storage containers 39f-39j which (before the operation of the pump 13) contain therein the sample 39(j) and several reagents. Downstream of the chip 21 and upstream of the fluid pump channel are arranged fluid storage containers 39a-39e which (before the operation of the pump 13) contain an appropriate working fluid therein. The working fluid forms a continuous body of fluid ideally without containing any air/gas bubbles or air/gas plugs therein and ideally without containing any other fluid immiscible with itself. This continuous body of working fluid may start from either directly upstream or downstream of the chip 21 and continuously extends to downstream of the fluid pump channel 15, that way priming the entire volume of the pump channel 15. During operation of the pump 13 the pressing element 11 is rotated at a desired velocity along a circular path coincident with the inner circular arc portion until the fluid packages pre-stored in the respective containers 39f-39j reach dedicated containers 39a-39e, respectively, that is, each fluid package is pumped through the chip 21 at least for one time. Thus, volume of each fluid package pre-stored in its respective container at the upstream of the chip 21 before operating the pump 13 shall more or less match volume of the working fluid pre-stored in its respective container at the downstream of the chip 21. This means that the sequence of fluid packages stored in containers 39f-39j before operating the pump 13 will be preserved in containers 39a-39e after operating the pump 13 for a total correct period of time depending on the velocity of each fluid package. Fluid storage container 39a comprising therein the fluid package which left the chip 21 at last and comprises the substance (educt or product) to be extracted may then be removed from the elastic layer 9. Fluid storage containers 39e-39b comprise therein the fluid packages which left the chip 21 earlier than the product. These containers 39e-39b comprise the waste that shall be properly discarded together with the used cartridge 1. The cartridge 1 having the fluid packages pre-stored in 39a-39j, the chip 21 and the pump channel 15/fluid channel 5 arranged in an entirely closed-loop channel format constitutes a self-enclosed system which can prevent exposure of any of these fluid packages pre-stored in 39a-39j to the environment. This is a useful feature in applications where any of these fluid packages is considered as a potential health threat to the user such as those including infectious samples and/or hazardous reagents. It is to be understood that this embodiment is not limited to the specific arrangement of the fluid storage containers 39a-39j, that is, the amount and the relative arrangement of fluid storage containers 39a-39j may vary from those shown in FIG. 16.

FIG. 17 shows a schematic top view on the pump according to an eighth embodiment of the present invention which is designed for performing a single sequential assay (single-inlet-single-outlet chip) on a given sample in a single cartridge with multiple pressing elements and corresponding magnets (not shown). According to this embodiment, a meander/serpentine shaped fluid channel 5 is formed within the channel layer 3, and four different reagents are stored within the meander shaped fluid channel 5 at one end thereof. The different fluids are arranged in series and are respectively separated from each other via an air plug/charge. The first, second and third reagents are respectively stored in the fluid channel 5 in the form of a single long (continuous) plug, and the fourth reagent is stored in the fluid channel 5 in the form of three short plugs followed by one long plug. The long plug of the fourth reagent is followed by another air plug which is followed by a working liquid. The working liquid may be any liquid which is suitable to be pumped, inert with regard to the channel layer 3 and the chip 21 and does not contain any gas such as air bubbles therein. A microfluidic chip 21 is provided in the centre of the fluid cartridge 1. The one end of the meander shaped fluid channel 5 can be fluid-connected to the inlet 23 of the microfluidic chip 21 via another fluid channel serving as a chip inlet channel which is connected to the one end of the fluid channel 5 via a dummy line 47 which is removable and replaceable by a fluid storage line 43 containing a sample therein. The dummy line 47 is to keep the meander shaped fluid channel 5 closed until the user replaces the dummy 47 with a real fluid storage line 43 containing therein the sample to be analyzed or processed. The other end of the meander shaped fluid channel 5 can be connected to the outlet 25 of the chip 21 via yet another fluid channel serving as a chip outlet channel by connecting the other end of the meander shaped fluid channel 5 with the chip outlet channel by means of a product storage line 46. The product storage line 46 is a removable non-integral fluid storage line to contain the potential product at the completion of the pump operation. During operation of the pump 13 three magnetisable balls serving as pressing elements 11 are controllably rotated along and pressed against the circular path indicated by a dashed line thereby displacing working liquid out of the fluid pump channel 15. The displaced/pressurized working liquid pushes the reagents stored at the one end in the fluid channel 5 and the sample stored in the fluid storage line 43 (replacing dummy line 47) forward through the chip inlet channel and into the chip 21. After passing through the chip 21, the reagents leave the same through the chip outlet 25 and the chip outlet channel. The fourth/last reagent will be collected as product in the product storage line 46. In this embodiment, the fourth reagent is delivered in three short successive plugs followed by a long plug. The three short plugs are for cleaning any residual trace left along the channels and in the chip 21 from the sample and previously delivered reagents so that such residual trace would not contaminate the long plug of the last reagent which will be collected as product. The three short plugs of the fourth reagent will be sent to waste. According to this embodiment the working liquid is used to prime the fluid pump channel 15 and to push all the reagents and sample loaded at the downstream of the fluid pump channel 15 forward and into the chip 21. The cartridge according to this embodiment is a completely closed (self-enclosed) system. According to this embodiment, non-integral fluid storage devices are only used for the sample and for the product. However, those skilled in the art can understand that the shown pump can be easily modified to make use of such non-integral removable storage devices for also other reagents which are currently shown stored in the fluid channel of the cartridge.

FIG. 18 shows a schematic top view on the pump according to a ninth embodiment of the present invention which is designed for simultaneously performing four sequential assays (single-inlet-single-outlet) on four samples in a single cartridge with four pressing elements that can run in parallel, and FIG. 19 shows a schematic top view on the pump according to a tenth embodiment of the present invention which is designed for performing a single parallel assay (multiple-inlets-multiple-outlets) on a single or multiple samples in a single cartridge with multiple pressing elements that can run in parallel. According to these two embodiments, four separate meander shaped fluid channels 5 are formed within the channel layer 3, wherein each of the four fluid channels 5 comprises a circular arc portion respectively forming a fluid pump channel 15, each of said circular arc portions having the same radius, and the circular arc portions of the four fluid channels 5 being arranged along a same circular path indicated by a dashed line in FIGS. 18 and 19. An end portion of each of the four meander shaped fluid channels is arranged within the circular path. Within this end portion each of the four fluid channels 5 comprises a sequence of different fluids/reagents required for the assay(s) performed by the chip 21. A microfluidic chip 21 having four outlets 25 and four inlets 23 is provided within the circular path. According to the embodiment shown in FIG. 18 each of the end portions arranged within the circular path can be connected to a separate inlet 23 of the chip 21 via a separate fluid channel serving as a chip inlet channel which is connected to the respective end portion via a dummy line 47 being replaceable by a fluid storage line containing a sample therein. According to the embodiment shown in FIG. 19 only two dummy lines 47 are provided, wherein two of the end portions arranged within the circular path are directly connected to a separate inlet 23 of the chip 21. In both embodiments the other end portion of each of the four fluid channels can be fluid-connected to a separate outlet 25 of the chip 21 via a respective separate fluid channel serving as a chip outlet channel, the respective chip outlet channel being connected to the respective other end portion via a removable product storage line 46.

The embodiments shown in FIGS. 17-19 clearly demonstrate that a working liquid can be used to prime the fluid pump channel 15 and to push all the reagents and sample loaded at the downstream of the fluid pump channel 15 into the chip 21. The respective pump 13 or cartridge 1 makes use of a working liquid that is inert to the cartridge 1 and to the chip 21 in order to indirectly push reagents through the chip 21. The working liquid does not contain any gas bubbles. Only the working liquid is allowed in the fluid pump channel 15. The last reagent can be separated from the working liquid by a gas charge. All the reagents are stored in the cartridge between the working liquid and the chip 21. These drawings also show completely closed (self-enclosed) systems. The schematics are drawn such that the cartridges use non-integral fluid storage devices only for the sample and for the product. However, those skilled in the art can understand that these shown cartridges/pumps can be easily modified to make use of such non-integral removal devices for also other reagents which are currently shown stored in planar fluid channels of the cartridge.

FIG. 20 shows a cross-section of the pump according to an eleventh embodiment of the present invention. According to this embodiment, a relatively rigid element such as a stiff covering layer 48 is provided on the elastic layer 9. The rigidity of the covering layer 48 is greater than that of the elastic layer 9. A groove is formed on the lower surface of the covering layer 48, for example by machining. The covering layer 48 is then arranged on the elastic layer 9, for example by bonding, with the lower surface of the covering layer 48 facing the upper surface of the elastic layer 9. The groove (together with the upper surface of the elastic layer 9) forms a guiding channel in which at least one pressing element 11 (two balls in this embodiment) is accommodated. Thus, at least a portion of the guiding channel coincides with at least a portion of the at least one fluid pump channel 15. In this embodiment, the guiding channel is formed as a guiding orbital channel which is coincident with the circular path along which the at least one pressing element 11 rotates in FIGS. 17 to 19. According to this embodiment, the pressing element 11 of the pump 13 is provided/supplied together with the cartridge 1, and is also discarded together with the used cartridge 1. By providing such a covering layer 48 on top of the elastic layer 9 any undesired expansion of the elastic layer 9 and any discharge of gas plugs through the elastic layer 9 are prevented.

Figure 21A:
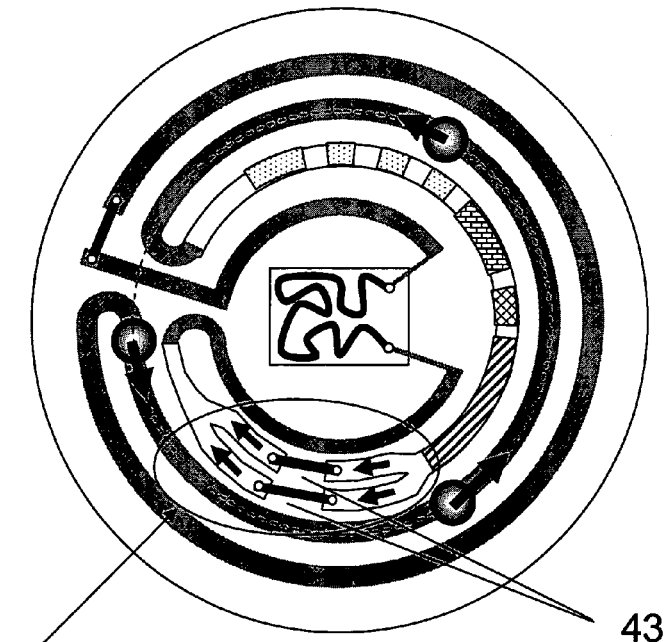

FIGS. 21a to 21d show different schematic top views of the pump according to a twelfth embodiment of the present invention. In FIG. 21a, according to an embodiment of the invention (related to FIG. 17), the dummy line 47 (and hence the fluid storage line 43 containing a sample in this embodiment) can be arranged in parallel with another fluid storage line 43 that contains a desired reagent such as lysis buffer to be mixed with the sample. These fluid storage lines 43 can be either an integral (non-removable) part of the cartridge 1 in which case it has to be pre-loaded during manufacturing or it can be a non-integral (removable) part of the cartridge 1 in which case it has to be provided by the user before actual test by replacing a dummy line 47. Without such embodiment, for instance the situation in FIG. 17, the user himself/herself may have to mix the sample with the desired reagent (e.g. lysis buffer) before loading the mixture in a fluid storage line 43 which would replace the dummy line 47 on the cartridge 1. However, this approach requires further handling of the sample and hence is not preferred. With the embodiment shown in FIG. 21a, the user only needs to provide the sample in a fluid storage line 43 and perhaps the reagent (if not pre-loaded in the cartridge). Mixing of the two can take place within the fluid cartridge 1 as both will merge and flow together once the working liquid starts to push them with the activation of the pump 13.

In this particular embodiment of FIG. 21a, the two fluid storage lines 43 (the sample and the reagent to be mixed) are arranged in parallel such that both are to source from different branches of a same fluid channel 5 and terminate at different branches of another same fluid channel 5.

Figures 21B, 21C, 21D:
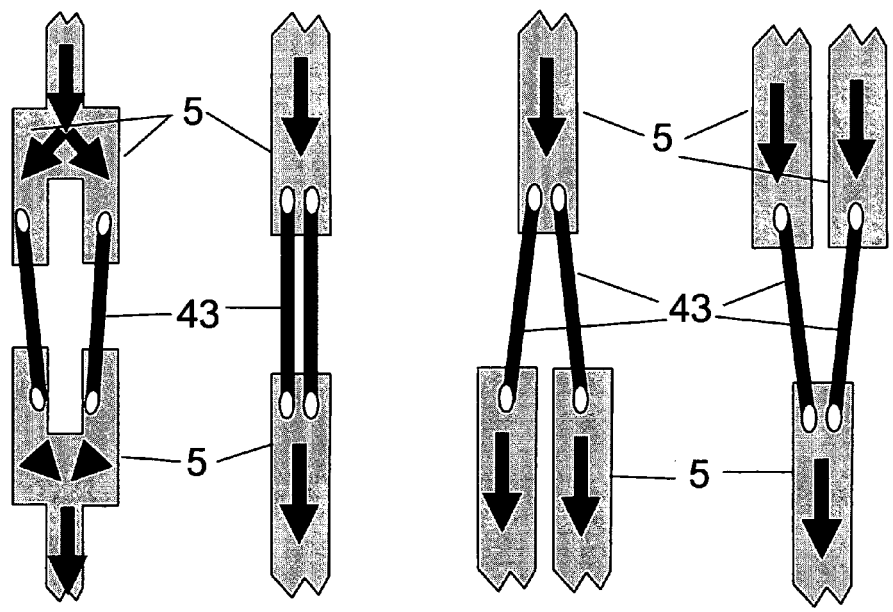

Other applications of the cartridge 1 may require any of the possible configurations described in FIGS. 21b to 21d. FIG. 21b is a special case of FIG. 21a when branching of neither source fluid channel 5 nor termination fluid channel 5 is required. This is simply the case when both fluid storage lines 43 are to source from a same fluid channel 5 and terminate at another same fluid channel 5. FIG. 21c involves the embodiment when both fluid storage lines 43 are to source from a same fluid channel but terminate at another different fluid channels 5. FIG. 21d is the embodiment when both fluid storage lines 43 are to source from different fluid channels 5 but terminate at another same fluid channel 5. The branching of the fluid channels 5 are not limited to the embodiments listed above. Any other combination is also possible.

In order to create fluidic channels 5 in the cartridge 1, a further embodiment of the invention makes use of readily available commercial plastic tubings 50. These tubings 50 are ideal for sequential injection of plugs of different reagents since they tend to minimize dispersion of liquid plugs by their circular cross-sectional profile and smooth inner walls. Hence, such a method eventually reduces the problem of cross-contamination between successive plugs of reagents when they flow along the same fluidic channel 5. This may not be the case when the fluidic channels 5 are directly formed in the cartridge 1 by etching or embossing the substrate which are most likely to produce cornered cross sections and non-smooth surface profiles. This can also put certain restriction on the material choice of the cartridge 1 as this material will come in direct contact with reagents. On the other hand, the commercial tubings 50 offer a variety of chemical structures and can be suitably chosen such that they would not react with any of the stored reagents. The use of plastic tubings 50 for the fluidic channels 5 also offers the benefit of minimizing dead volume at the joints between the fluidic channels 5 and the fluid storage containers 39 or lines mounted on the cartridge 1. Such dead volume usually traps reagents and introduce reagent cross-contamination in a sequential flow system.

Figure 22A:
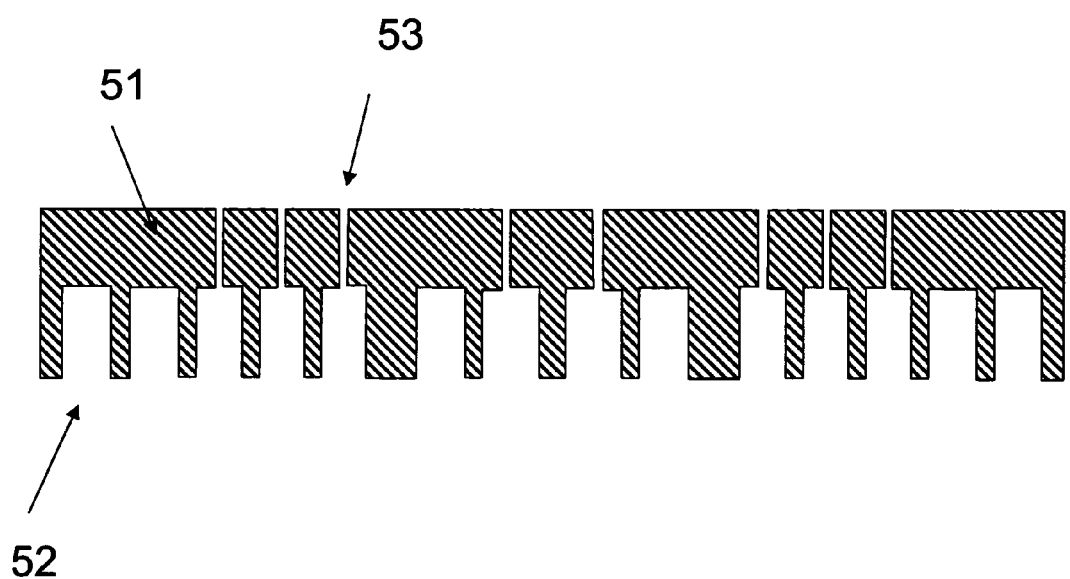
Figure 22B:
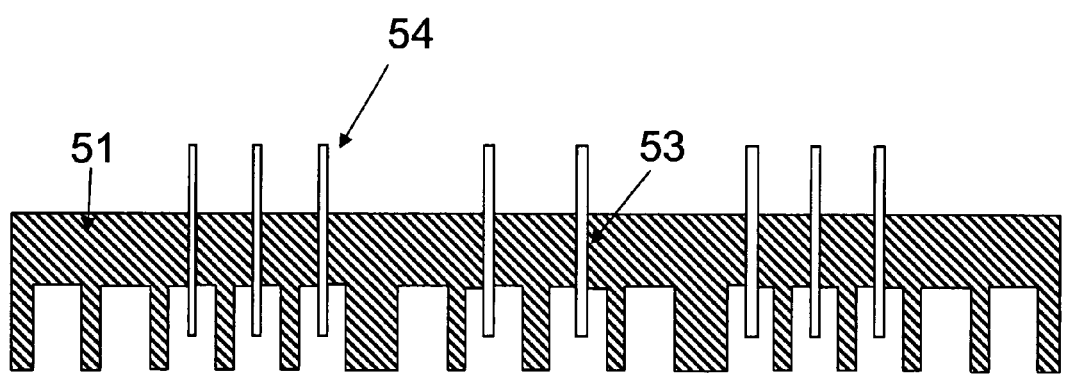

FIGS. 22a to 22f show a method of fabricating fluidic channels utilizing tubings according to an embodiment of the present invention. In FIG. 22a, the main component of this embodiment, a pre-structured solid substrate 51 is disclosed. A plurality of grooves 52 (forming a spiral or serpentine layout) for tubings are created in a bottom surface of the pre-structured solid substrate 51 and a set of corresponding thorough holes 53 for inserting the fluidic pins 54 are also created on a top surface of the pre-structured solid substrate 51 at appropriate locations. Cross-section of the grooves 52 can be of any arbitrary shape as long as they are larger than the outer diameter of the commercial tubings 50 which are to be placed in. The thorough-holes 53 should be at an appropriate size so as to securely hold fluidic pins 54 to be inserted as shown in FIG. 22b.

In FIG. 22b, the fluidic pins 54 are inserted in the through-holes 53 of the pre-structured solid substrate 51. These fluidic pins 54 can either be substantially straight or more preferably "L-shape" in order to save space or to reduce thickness of the rigid substrate 51.

Figure 22C:
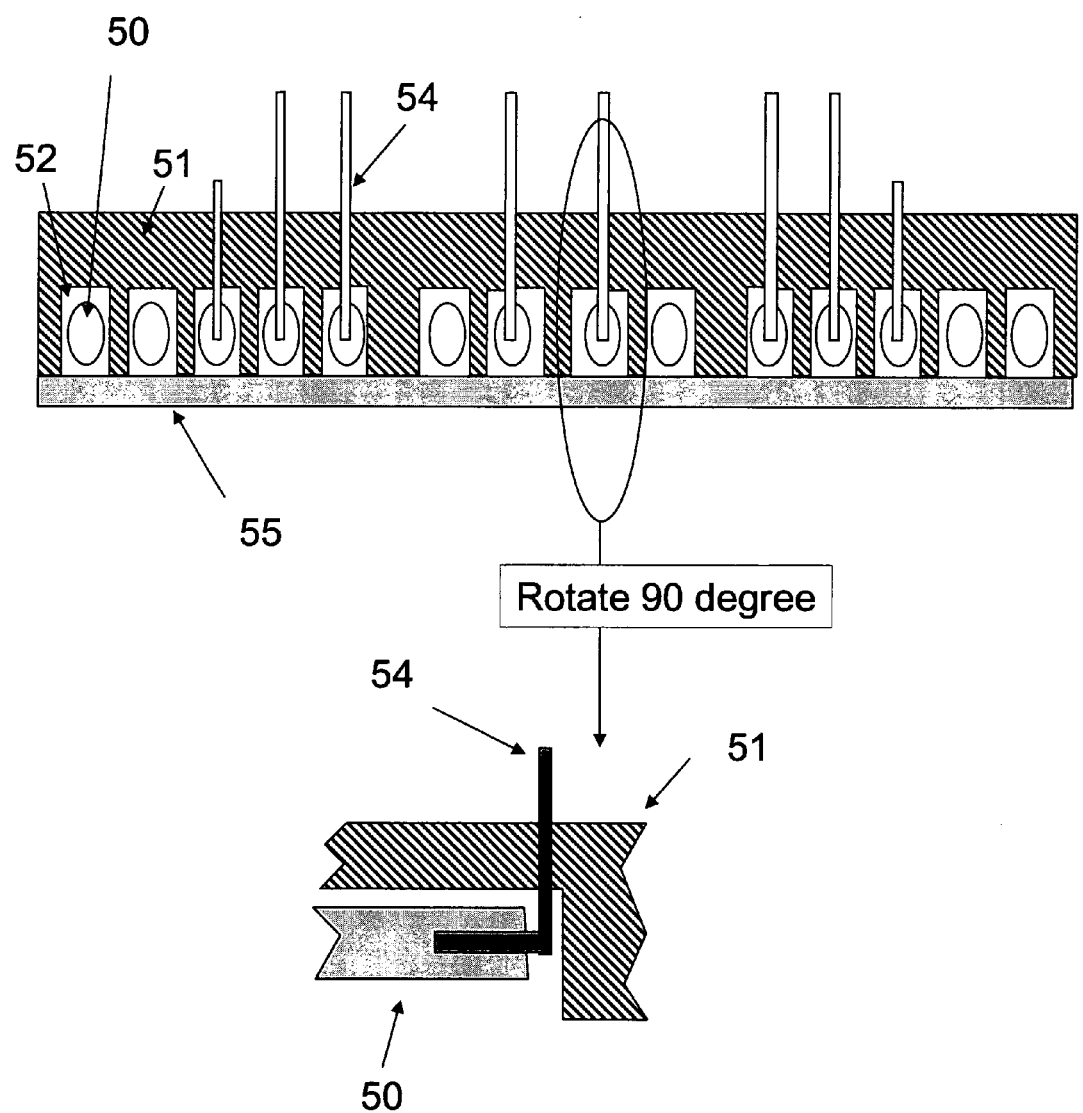

In FIG. 22c, plastic tubings 50 of an appropriate length are placed in the grooves 52 of the substrate 51 and the ends of the tubings 50 are connected to the respective fluidic pins 54. After that, the grooves 52 are sealed by an adhesive tape 55 for example a dicing or grinding tape by laminating onto the bottom of the solid pre-structured substrate 51.

Figure 22D:
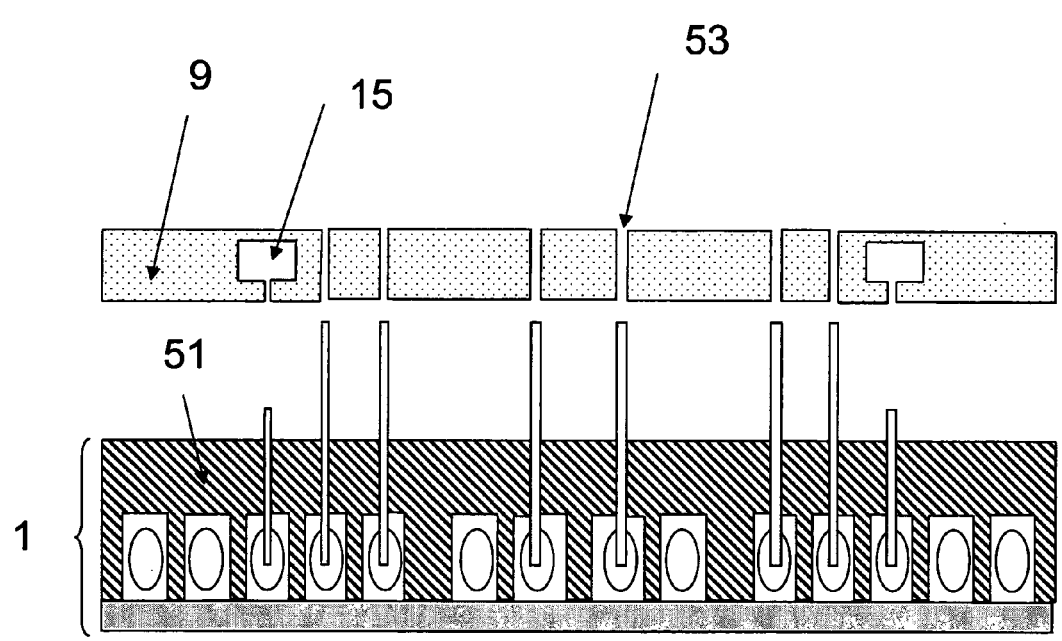

In FIG. 22d, an elastic layer 9 which contains the fluid pump channel 15 is brought to be in alignment with the solid pre-structured substrate 51. The elastic layer 9 is a separate entity from rest of the cartridge 1. A set of corresponding thorough holes 53 for inserting the fluidic pins 54 are also created in the elastic layer 9.

Figure 22E:
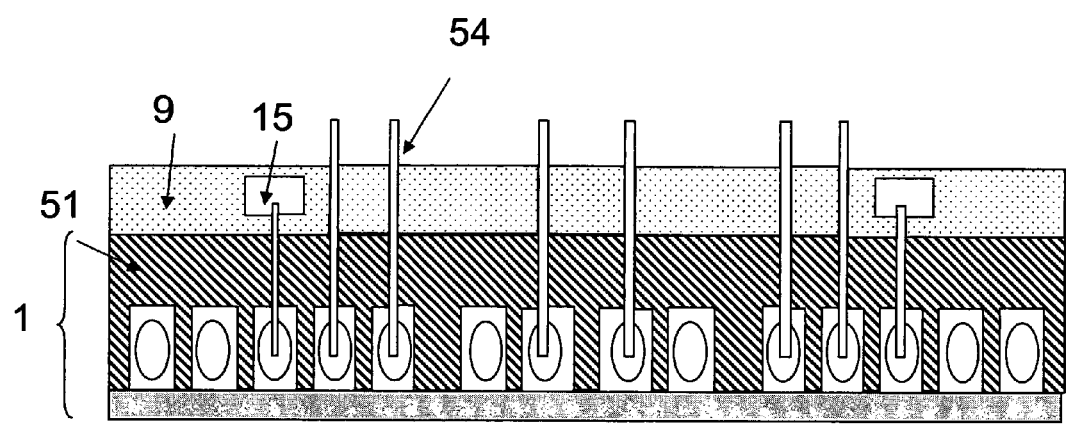

In FIG. 22e, the elastic layer 9 is aligned and mounted on the solid pre-structured substrate 51 with the respective fluidic pins 54 inserted into the respective inlet and outlet holes of the pump channel 15. The elastic layer 9 also contains large enough thorough-holes 53 at locations overlapping the fluidic pins 54 that are not utilized by the pump channel 15 so that they can be accessed from top even after placing the elastic layer 9 on the cartridge 1.

Figure 22F:
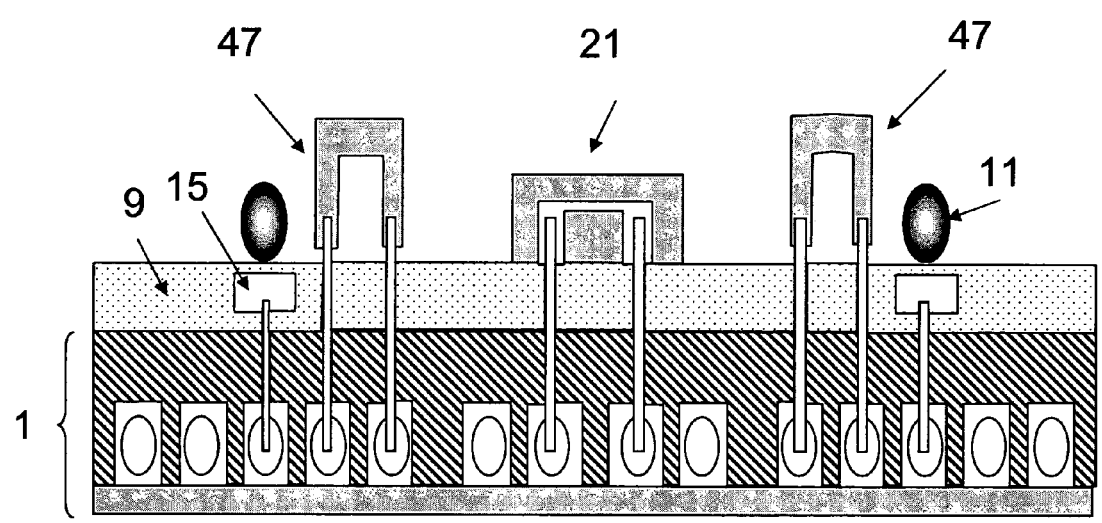

In FIG. 22f, after mounting the elastic layer 9, the chip 21 and the respective dummy lines 47 for product and for sample are also mounted on the respective fluidic pins 54 to enclose the entire cartridge 1 forming a self-contained closed system. Before a complete enclosure, the cartridge 1 and the pump channels 15 must be filled with the corresponding reagents and working liquid accordingly. To use the cartridge 1, the user has to remove dummy storage lines 47 or caps sealing the fluidic pins 54 and replace them with the sample storage line 43 and product storage line 46 (also reagent lines, if needed by the application). The user then places the entire cartridge 1 over a magnetic field and positions the pressing elements 11 on the elastomer pump channel 15. The rest of the procedure is as described by the invention.

While a few embodiments of the fluid cartridge, pump and fluid valve arrangement have been described and illustrated, it is to be understood that many changes, modifications and variations may be made to the present invention without departing from the scope of said invention.

What is claimed is:

1. A fluid cartridge, comprising:
 a channel layer within which at least one circumferentially sealed fluid channel is formed, the channel layer comprising:

a substrate, and an elastic layer fixedly arranged on the substrate, a microfluidic chip being located in or on the channel layer and being in fluid connection with the at least one fluid channel;

one or more fluid storage lines and/or one or more fluid storage containers being arranged in or on the channel layer and being in fluid connection with the at least one fluid channel;

wherein the substrate has a rigidity being greater than that of the elastic layer;

wherein the at least one fluid channel is defined on at least one side thereof by the elastic layer;

wherein the one or more fluid storage lines are non-integrally formed with regard to the channel layer and are removably and/or replaceably arranged in or on the channel layer;

wherein the at least one fluid channel forms a closed loop with the microfluidic chip and the one or more fluid storage lines and/or the one or more fluid storage containers being connected in series therebetween;

wherein two separate fluid channels are formed within the channel layer which are connected with each other via a dummy which is replaceable by a fluid storage line or a fluid storage container containing a sample therein.

2. The fluid cartridge according to claim 1, wherein the at least one fluid channel is exclusively formed within the elastic layer.

3. The fluid cartridge according to claim 1, wherein the at least one fluid channel is defined on at least one side thereof by the substrate.

4. The fluid cartridge according to claim 3, wherein the at least one fluid channel is partly formed within the elastic layer and partly formed within the substrate.

5. The fluid cartridge according to claim 3, wherein the elastic layer comprises a groove provided on the lower surface thereof and covered by the substrate thereby forming the at least one fluid channel.

6. The fluid cartridge according to claim 3, wherein a groove is provided on the upper surface of the substrate, which is covered by the elastic layer thereby forming the at least one fluid channel.

7. The fluid cartridge according to claim 1, wherein the elastic layer comprises an elastomer.

8. The fluid cartridge according to claim 1, wherein the substrate is made of an electrically/magnetically inert material and/or does not behave as a magnetic shield.

9. The fluid cartridge according to claim 1, wherein a covering layer having a rigidity being greater than that of the elastic layer is provided on the elastic layer.

10. The fluid cartridge according to claim 1, wherein two separate fluid channels are connected with each other via one fluid storage container.

11. The fluid cartridge according to claim 1, wherein three separate fluid channels are connected in series via two fluid storage containers.

12. The fluid cartridge according to claim 1, wherein two fluid storage containers are
   arranged in or on the channel layer so as to source from a same fluid channel (or to branch of a same fluid channel) and terminate at another same fluid channel (or to branch of another same fluid channel).

13. The fluid cartridge according to claim 1, wherein two fluid storage containers are
   arranged in or on the channel layer so as to source from a same fluid channel and terminate at two different fluid channels.

14. The fluid cartridge according to claim 1, wherein two fluid storage containers are
   arranged in or on the channel layer so as to source from two different fluid channels and terminate at a same fluid channel.

15. The fluid cartridge according to claim 1, wherein the one or more fluid storage containers are non-integrally formed with regard to the channel layer and are removably and/or replaceably arranged in or on the channel layer.

16. The fluid cartridge according to claim 1, wherein two separate fluid channels are connected with each other via the at least one fluid storage line.

17. The fluid cartridge according claim 1, wherein within a single fluid channel a plurality of different fluids is stored, the different fluids being arranged in series and separated from each other.

18. The fluid cartridge according to claim 17, wherein the different fluids are separated from each other by a separating fluid being immiscible with the adjacent fluids.

19. The fluid cartridge according to claim 1, wherein a plurality of separate fluid channels is formed within the channel layer.

20. The fluid cartridge according to claim 1, wherein the at least one fluid channel is connected to an inlet of the chip at one end thereof, and wherein one or more fluids are stored in the at least one fluid channel, and wherein a working liquid is stored in the at least one fluid channel between the other end of the at least one fluid channel and the one or more fluids.

21. The fluid cartridge according to claim 3, wherein a groove is provided on a lower surface of the substrate for housing a tubing.

22. The fluid cartridge according to claim 21, wherein a through-hole is provided within the substrate for accommodating a fluidic pin.

23. The fluid cartridge according to claim 22, wherein the tubing is connected to the fluid channel via the fluidic pin.

24. The fluid cartridge according to claim 22, wherein the tubing is connected to the fluid storage container or fluid storage line via the fluidic pin.

25. The fluid cartridge according to claim 24, wherein the elastic layer further comprises a through-hole for accommodating the fluidic pin.

26. A fluid cartridge, comprising:
   a substrate in which a plurality of circumferentially sealed chambers or channels is firmed, and
   a plurality of fluid storage devices non-integrally formed with respect to the substrate and connected in series via the plurality of chambers or channels, wherein the respective fluid storage device is a fluid storage line or a fluid storage container, each fluid storage device comprising a different fluid therein,
   and a first and a last of the plurality of fluid storage devices having a respective free end serving as connection end,
   a microfluidic chip being located in or on the upper surface of the substrate and being in fluid connection with one of the two connection ends;
   wherein the one or more fluid storage lines are non-integrally formed with regard to the channel layer and are removably and/or replaceably arranged in or on the channel layer;
   wherein the plurality of the chambers or channels form a closed loop with the microfluidic chip and the plurality of fluid storage devices being connected in series therebetween;

wherein two separate channels are connected with each other via a dummy which is replaceable by a fluid storage line or a fluid storage container containing a sample therein.

* * * * *